United States Patent [19]

Guadagnolo

[11] 4,209,835
[45] Jun. 24, 1980

[54] PULSE REPETITION INTERVAL AUTOCORRELATOR SYSTEM

[75] Inventor: Robert N. Guadagnolo, Burbank, Calif.

[73] Assignee: Hughes Aircraft Company, Culver City, Calif.

[21] Appl. No.: 926,971

[22] Filed: Jul. 21, 1978

[51] Int. Cl.² ............................................. G06F 15/34
[52] U.S. Cl. .............................. 364/715; 343/17.1 PF; 364/728
[58] Field of Search ............. 364/715, 728; 343/5 DP, 343/17.1 PF, 100 CL

[56] References Cited

U.S. PATENT DOCUMENTS

| 3,495,077 | 2/1970 | Hiltz et al. ........................ 364/728 X |
| 3,881,101 | 4/1975 | Pederson et al. ...................... 364/728 |

OTHER PUBLICATIONS

Schmidt, "On Separating Interleaved Pulse Trains," IEEE Trans. on Aerospace & Electronic Systems, Jan. 1974, pp. 162–166.

Primary Examiner—David H. Malzahn
Attorney, Agent, or Firm—Walter J. Adam; W. H. MacAllister

[57] ABSTRACT

A PRI (pulse repetition interval) autocorrelator that functions as a data analyzer for recognition of PRIs in a data set composed of time ordered TOA (time of arrival)) words representing the time of reception of a plurality of pulses from a plurality of emitters. The processing of a data set is performed at each of a plurality of cells of a plurality of coarse map intervals or octaves by adding an incremental assumed periodicity $\tau$ to the time of arrival and performing an autocorrelation comparison of the data set for each cell to provide correlation counts. An amplitude ordered list is then formed of the cell correlation counts which are greater than a threshold and subcells of each cell on the list are subject to a fine level autocorrelation for determining the PRI.

21 Claims, 40 Drawing Figures

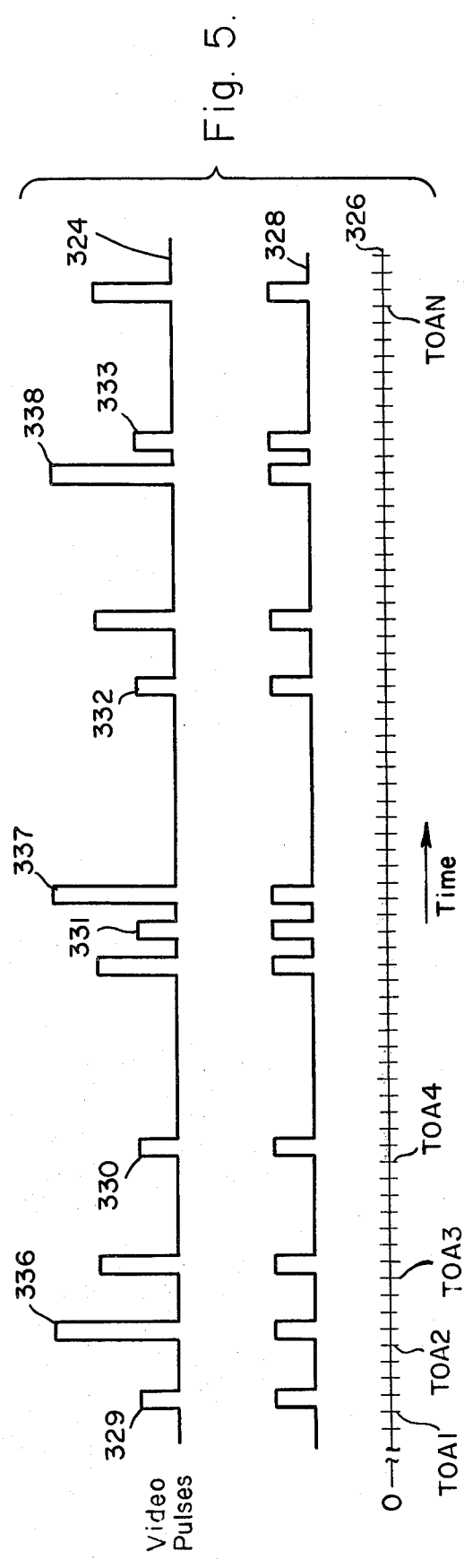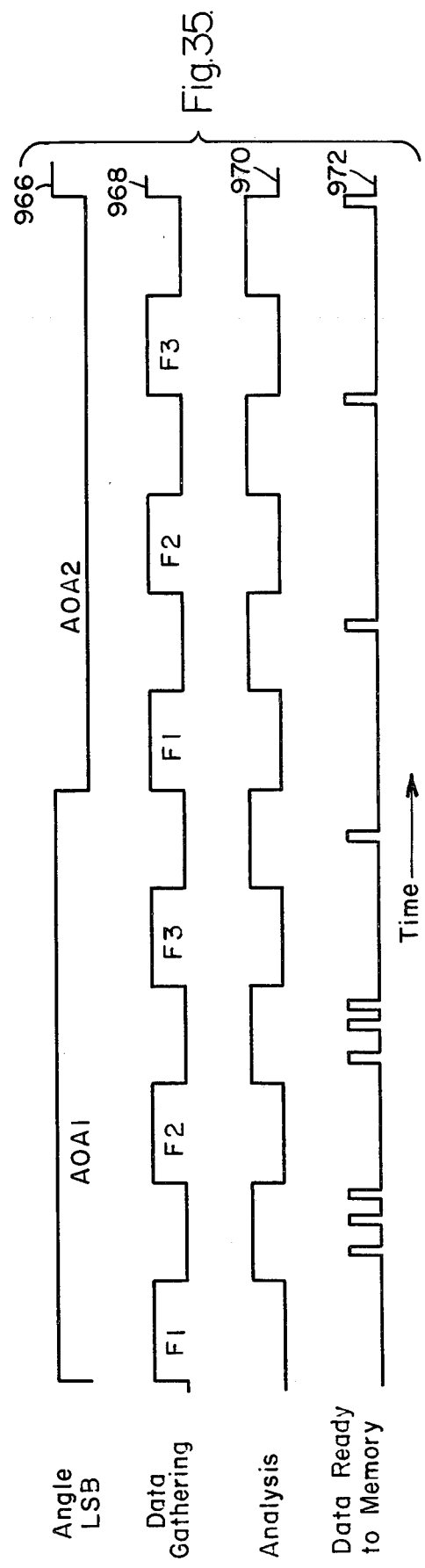

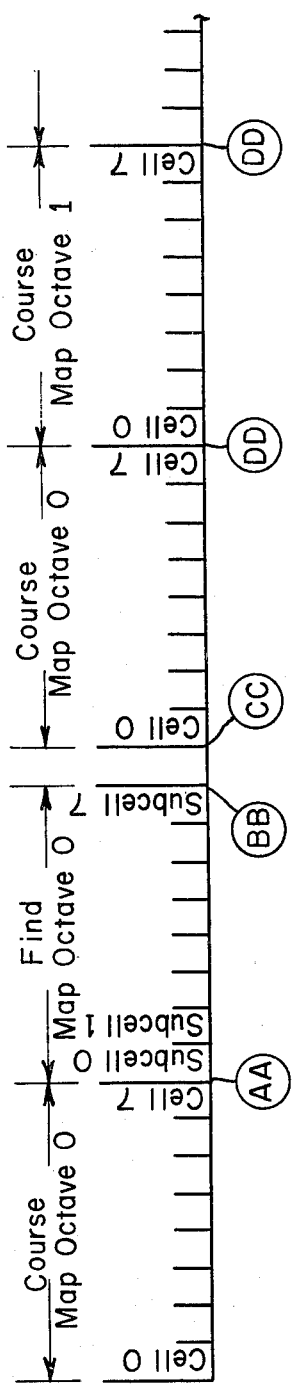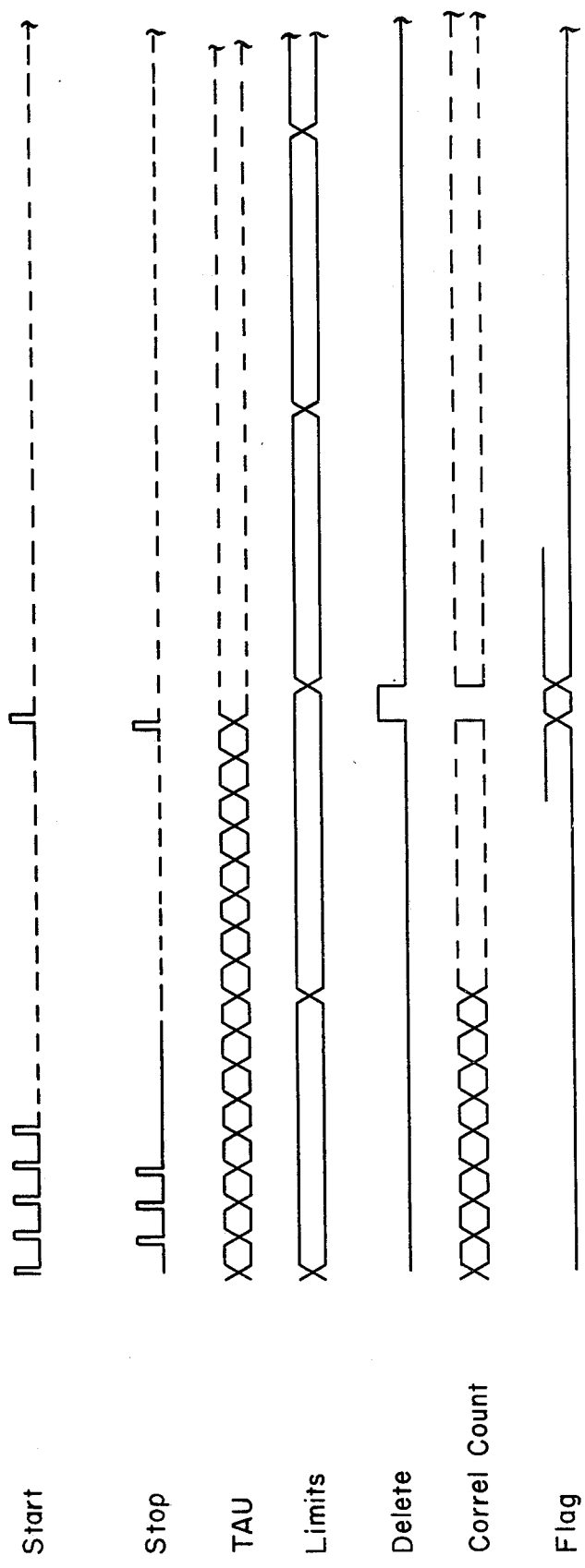
Fig. 13a.

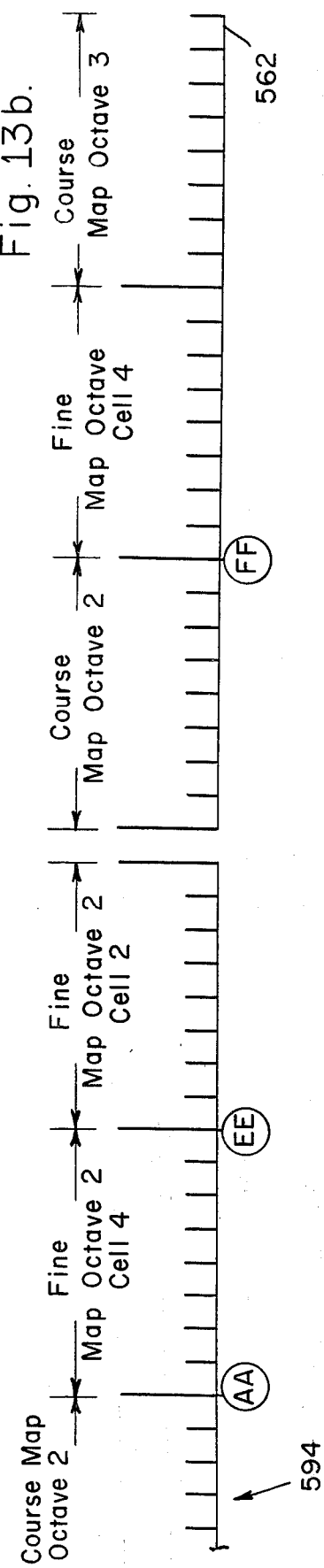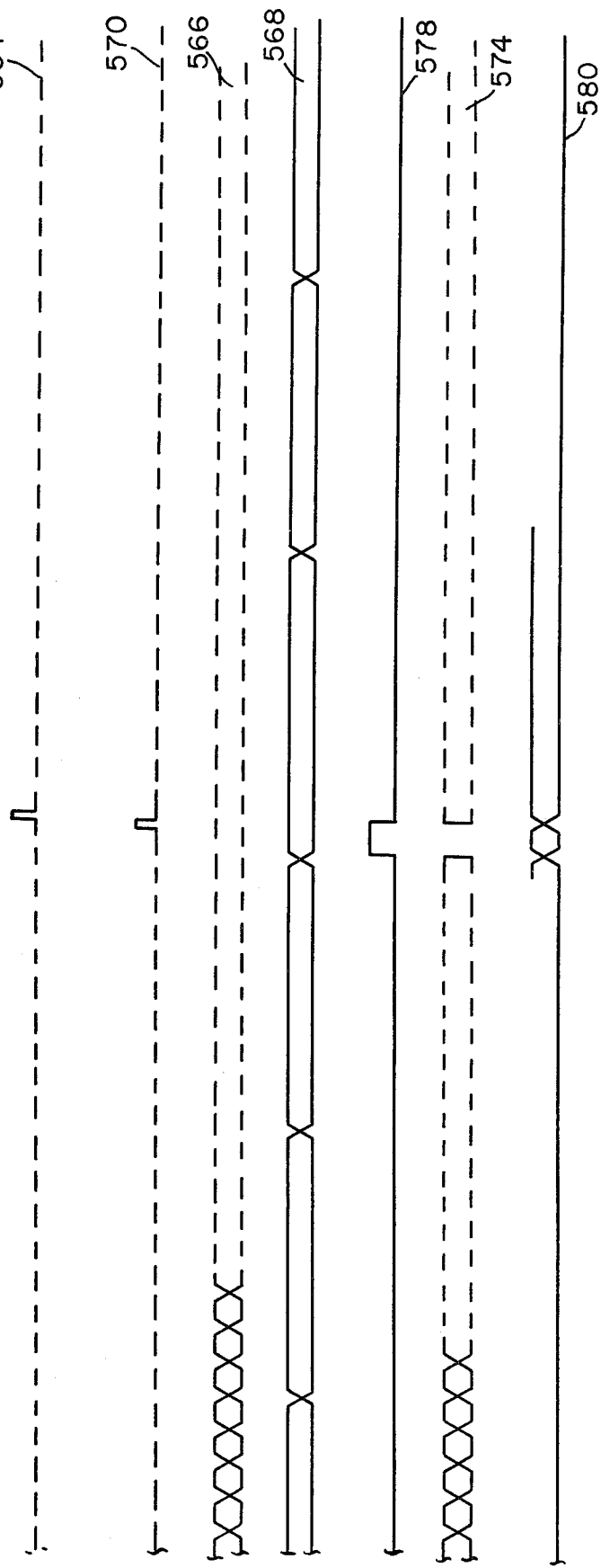
Fig. 13b.

| Emitter No. | AOA | RF(MHz) | PRI ($\mu$Sec) |
|---|---|---|---|
| 1 | 0 | 1000 | 1000 |
| 2 | 0 | 1000 | 900 |
| 3 | 0 | 1000 | 910 |
| 4 | 0 | 1000 | 100 |
| 5 | 0 | 1000 | 2000 |
| 6 | 0 | 2000 | 1500 |
| 7 | 0 | 2000 | 700 |
| 8 | 0 | 2000 | 150 |

Output Memory

PULSE REPETITION INTERVAL AUTOCORRELATOR SYSTEM

BACKGROUND OF THE INVENTION

This invention relates to a PRI (pulse repetition interval) autocorrelation system responsive to pulse time of arrival data received from a plurality of emitters and particularly to an improved PRI autocorrelation system that operates at a high speed, provides highly accurate processing and detects emitters substantially without the erroneous effects of incomplete time of arrival data sets.

PRI autocorrelation is a technique for mapping relative activity versus PRI of a data sample formed as time of arrival (TOA) digital words marking the changing occurrence of pulse inputs received by a receiver system from a plurality of emitters. The data map of activity versus PRI is used to determine the most likely PRI or PRIs at which emitters might be found. The PRI values each derived from a specific emitter are then utilized for emitter identification, for tracking or for further processing. The electronic warfare defense systems in which PRI values are utilized are discussed, for example, in *Electronic Warfare*, Vol. 5, No. 4, August 1973, pp. 62–65 which discusses an EW (Electronic Warfare) system in which alphanumerical displays are provided showing signal frequency and pulse repetition frequencies as well as other parameters. Also a system is discussed in the *Electronic Warfare*, Vol. 10, No. 1, January 1978, in an article entitled "EW Defense Electronics" in which an ESM system developed by Deca Radar, Hersham, England is discussed. Conventional techniques for PRI identification involve computation of the time difference between data samples and picking the difference with the greatest number of occurrences.

Because of the large amount of data that can be generated in the course of time differencing, relatively few samples are used to make a decision and thus mistakes in the determination of the presence of an emitter may occur. Typically TOA differencing algorithms select only a single difference and seek to confirm it to save time. Thus, differencing systems are highly susceptible to missing pulses in the data sets, resulting in matching of harmonics rather than the fundamentals and erroneous indication of the presence of emitters. Other prior art techniques of PRI data mapping for identification, involve fast Fourier transforms, chirp Z transforms and Walsh transform methods, all of which have the limitations that they are substantially unable to identify intermittent pulse groups because of the fixed time record length requirements of these techniques. Also, all of the above mentioned prior art concepts are relatively complex and relatively slow in operation.

SUMMARY OF THE INVENTION

The system in accordance with the invention utilizes autocorrelation for determining the PRI of a data sample containing time or arrival (TOA) digital words marking the occurrence of pulse inputs intercepted by a receiver system from emitters. The data sample is a data set of time order TOA words in which autocorrelation is performed to find the occurrence of repetitive pulses above and adaptive threshold level. The processing is broken up into coarse level map intervals or octaves each including a plurality of cells such as eight which are initially processed in sequence for each sequential octave. Each cell is defined by a $\tau$ or assumed periodicity value which is the combination of a $\tau$ for that octave plus an incremental $\tau$ value which, for example, may be $\frac{1}{8}\tau$ for each subsequent cells in the octave. The value of $\tau$ at which an emitter is detected represents the group PRI value for that emitter. For each cell, the correlation count which will be utilized to determine the presence of an emitter is calculated in a cell calculator which addresses a first TOA word in a TOA word memory and transfers it to a holding register. The memory address is then cycled to a second TOA word while the holding register value is modified by the addition of a first offset time $\tau$ and upper and lower limit tolerances. The second memory data word is then compared to the TOA word in the holding register and if a comparison or match is detected, a subsequent comparison may be then made with a first TOA word combined with twice the $\tau$ and limits to determine if a second match is present. Each time that two matches are detected for a TOA word in the holding register, the correlation count is incremented. In the comparison operations, if the data word has a value less than the upper limit and less than the lower limit, the address is updated to memory word 3 which is then received for comparison with the first TOA word. If the data word is greater than the upper limit, the address is cycled to send a second data word to the holding register and the autocorrelation process is repeated. This process continues for the cell until all words have been stored in the holding register and compared with increased value TOA words. When all TOA words have been cycled through the holding register and have been compared for matches, the correlation count is stored in a processor memory along with the corresponding $\tau$. When a complete coarse level data map of the correlation counts is stored for the first octave, a threshold is then established by the processor and all cells that exceed this threshold are ordered in a list starting with the values having the largest amplitude. The cell calculator is then controlled to examine the first cell of the ordered list in a fine level correlation mode which is performed in eight subcells by providing appropriate $\tau$ values and storing a fine level correlation count data map. The SUBCELL of the fine calculation that has the largest correlation count above a calculated threshold represents an emitter having a periodicity equal to the value of $\tau$ utilized in the correlation of that subcell. A deletion mode signal is applied to the cell processor and the TOA values which match in the correlation of that cell are flagged or effectively deleted from the data set. After the deletion mode, a coarse data map of the entire octave is then again calculated to form a new coarse level amplitude ordered data list. The cell calculator in response to the processor then selects the first cell, if any, on the new ordered list, and again performs a cell calculation at the fine level, followed by a deletion if a correlation count of a subcell exceeds the threshold. Upon completion of detection of all emitters in that octave, the processor increments the octave number and a correlation count data map for the cells of the next octave at the coarse level is then formed. In the illustrated arrangement, this process continues until the computation has been completed for all of the octaves for that data set and the detected PRIs along with the angle of arrival (AOA) and the frequency RF are transferred to an output memory for display along with the values from a plurality of other data sets. The autocorrelation system of the invention has the advantage that by the ordered processing of the time ordered data sets, the fundamental signals representing an emitter are detected first and by flagging or by deleting the TOAs that contributed to an emitter correlation in the first octave in which that emitter appears, harmonics of that emitter are not erroneously correlated in subsequent octaves. Missing pulses in the data sets will not substantially effect the PRI values provided by the system of the invention.

It is therefore an object of this invention to provide a system for determining the pulse repetition intervals of a plurality of emitters;

It is a further object of this invention to provide a system responding to a data set representing the time of arrival of received pulses to develop pulse repetition intervals that are substantially unaffected by any harmonics developed in the processing;

It is another object of this invention to provide a pulse repetition interval autocorrelator for recognition of PRIs in a data set composed of time ordered words;

It is still a further object of this invention to provide a PRI autocorrelator of time of arrival data representative of the times of reception of a plurality of pulses that operates at a high speed with a minimum of complexity and that permits identification of intermittent pulse groups.

BRIEF DESCRIPTION OF THE DRAWINGS

The novel features of the invention will become apparent in light of the following detailed description taken in conjunction with the accompanying drawings; wherein:

FIG. 5 is a schematic diagram showing waveforms of time versus amplitude for explaining the generation of a data set in the autocorrelator memory;

FIGS. 13a and 13b are schematic diagrams of amplitude as a function of time for further explaining the system flow diagram of FIG. 12;

FIG. 35 is a schematic diagram of waveforms showing amplitude as a function of time for further explaining the overall operation of the illustrative system of FIG. 1.

DESCRIPTION OF THE PREFERRED EMBODIMENTS

Figure 1:
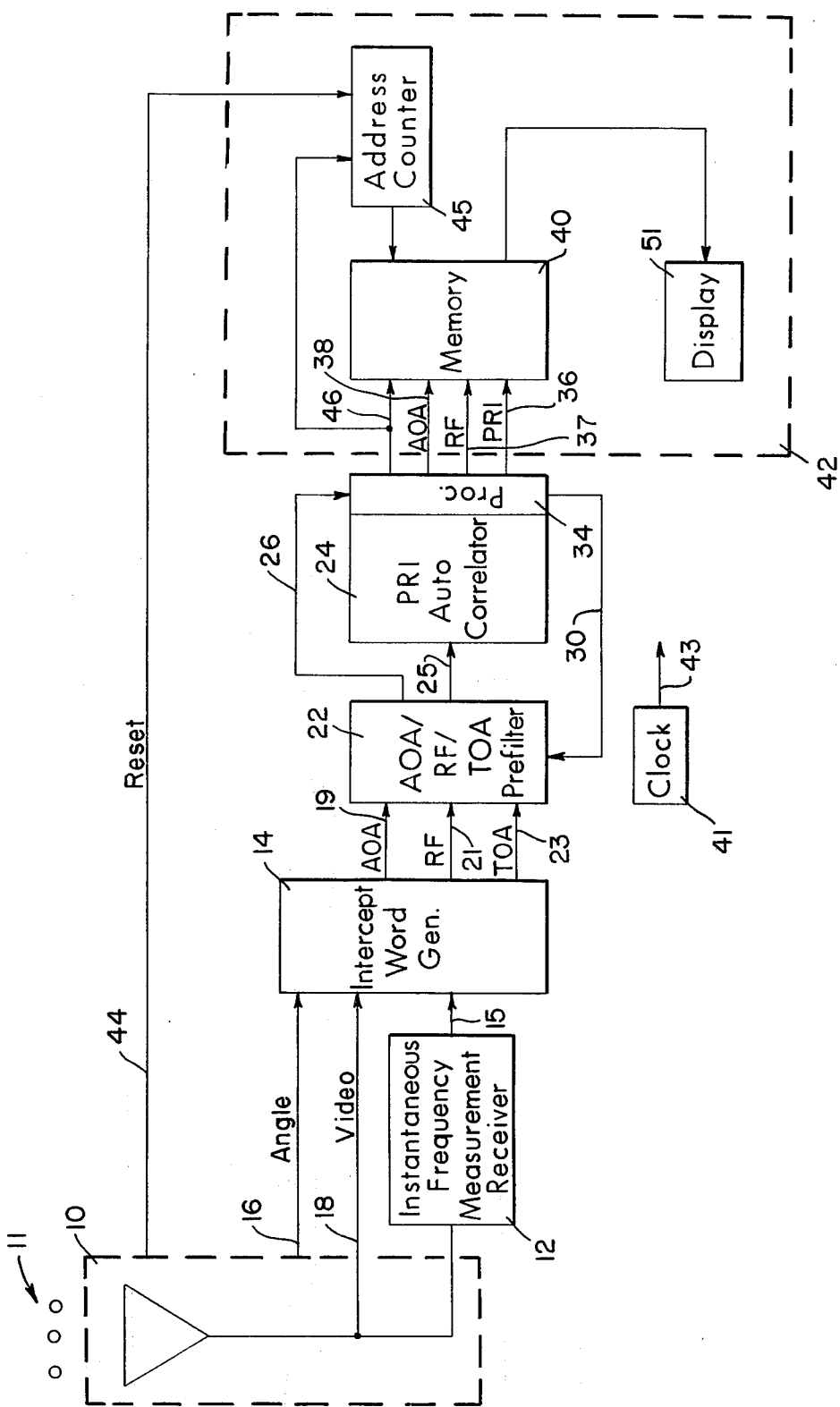
FIG. 1 is a schematic block diagram showing the electronic warfare system and the PRI autocorrelator of the invention.

Referring first to FIG. 1, a passive electronic warfare system is shown including the PRI (pulse repetition interval) autocorrelator system in accordance with the invention receiving pulses from a plurality of emitters. The illustrated system provides a display of PRI and other parameters determined from the reception of pulses such as TOA (time of arrival). It is to be noted that the principles of the invention are not to be limited to any particular source of emitter data but include data received from another system as well as data being internally generated by monitoring the time of arrival as in the illustrated system. Also, the invention is not to be limited to operation with any particular output or utilization unit but includes any suitable output unit such as steering systems utilizing PRI data in a computer, PRI tracking in a special processor, as well as an informational display as in the illustrated system. A direction finding (DF) system 10 receives a plurality of pulses from a plurality of emitters 11 which may emit radar pulses at a number of frequencies (RF), angle of arrivals (AOA) and PRI intervals. The frequency of the received energy may be measured in an instantaneous frequency measurement (IFM) receiver 12 which applies an encoded value representing the RF frequency through a composite lead 15 to an intercept word generator (IWG) 14 also receiving an angle signal and a video signal on respective leads 16 and 18. To develop the TOA data sets related to AOA and RF, a prefilter 22 is provided responsive to AOA, RF and TOA on respective leads 19, 21 and 23 and applying TOA signals to a PRI autocorrelator 24 on a composite lead 25 along with AOA on a lead 26. A reference frequency signal is received by the prefilter 22 on a lead 30 from a processor 34 included in the PRI autocorrelator 24.

For display of the PRI and other data such as RF and AOA, a display memory 40 of a utilization unit 42 receives the PRI, RF and AOA data from the processor 34 on respective leads 36, 37 and 38 and stores the data for display. In the illustrative arrangement, an address counter 45 addresses the memory 40 sequentially, being reset through a lead 44 when the antenna has rotated through a complete cycle. The memory 40 and the address counter 45 both may receive a transfer signal on a lead 46 indicating that a PRI value is being transferred so that a new address is provided and so that the PRI, AOA and RF values are gated into the location of the new address. Although in the illustrated system, the new output data is written over the old data for each antenna rotation cycle, the memory 40 may be cleared at the end of the cycle in some arrangements. A display 51 responds to the contents of the memory 40 to provide a display of the data and may be any suitable display unit such as a Hewlett Packard HP 26 45A Terminal. A clock 41 may provide clock signals through a lead 43 to the digital elements of the system.

Figure 2:
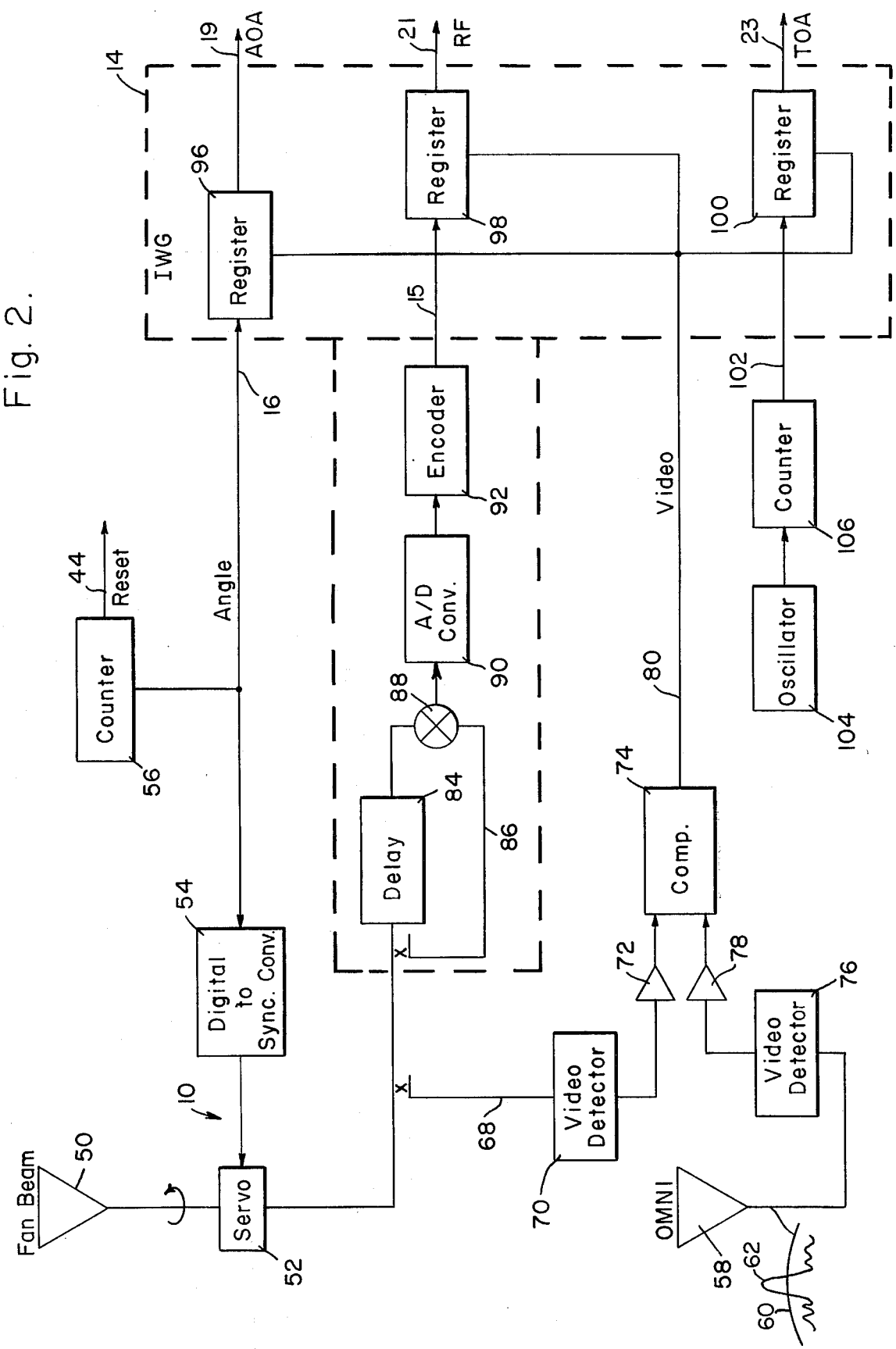
FIG. 2 is a schematic block diagram of the antenna arrangement, instantaneous frequency measurement system and the intercept word generator of FIG. 1.

Referring now also to FIG. 2, the direction finding system 10 may include a rotating fan beam antenna 50 responsive to a servo 52 which in turn is controlled by digital to synchro converter 54 receiving digital counts from a counter 56. The direction finding system 10 also includes an omnidirectional antenna 58 which may provide a beam pattern indicated at 60 while the rotating fan antenna 50 may provide a beam pattern indicated as 62, both beam patterns being in the azimuth dimension. A portion of the output energy from the fan beam antenna 50 is applied through a conductor 68, a video detector 70 and an amplifier 72 to a comparator 74. The output of the omnidirectional antenna 58 is applied through a video detector 76 and through an amplifier 78 to the comparator 74 to pass a signal to an output lead 80 when the amplitude of the antenna beam pattern 62 is greater than the amplitude of the omnidirectional beam pattern 60, thus providing the indication when the emitter is on the boresight in the azimuth dimension of the rotating antenna 50. The instantaneous frequency measurement unit 12 receives the RF signal from the antenna 50 and applies it through a delay unit 84 and a bypass path 86 to a mixer 88 which in turn provides an analog signal representative of the receiver RF frequency to an A/D converter 90. The signal provided by the A/D converter 90 is then applied through an encoder 92 to provide a digital RF signal on the lead 15. As is well known, with a selected delay value, the mixer 88 provides a signal representative of the frequency of the RF signal intercepted by the antenna 50.

The intercept word generator (IWG) 14 includes registers 96, 98 and 100 respectively receivibg angle data on the lead 16, RF data on the lead 15 and a count on a composite lead 102, which count is derived from an oscillator 104 and a counter 106. The signal on the lead 80 which may be a pulse indicating a boresight condition, gates or clocks the signals on leads 15, 16 and 102 into respective registers 96, 98 and 100. By gating the register 100, the TOA value count is stored in the register 100 when the angle of the emitter relative to the radar system is known. The AOA, RF and TOA values are respectively applied from registers 96, 98 and 100 to the composite leads 19, 21 and 23.

Figure 3:
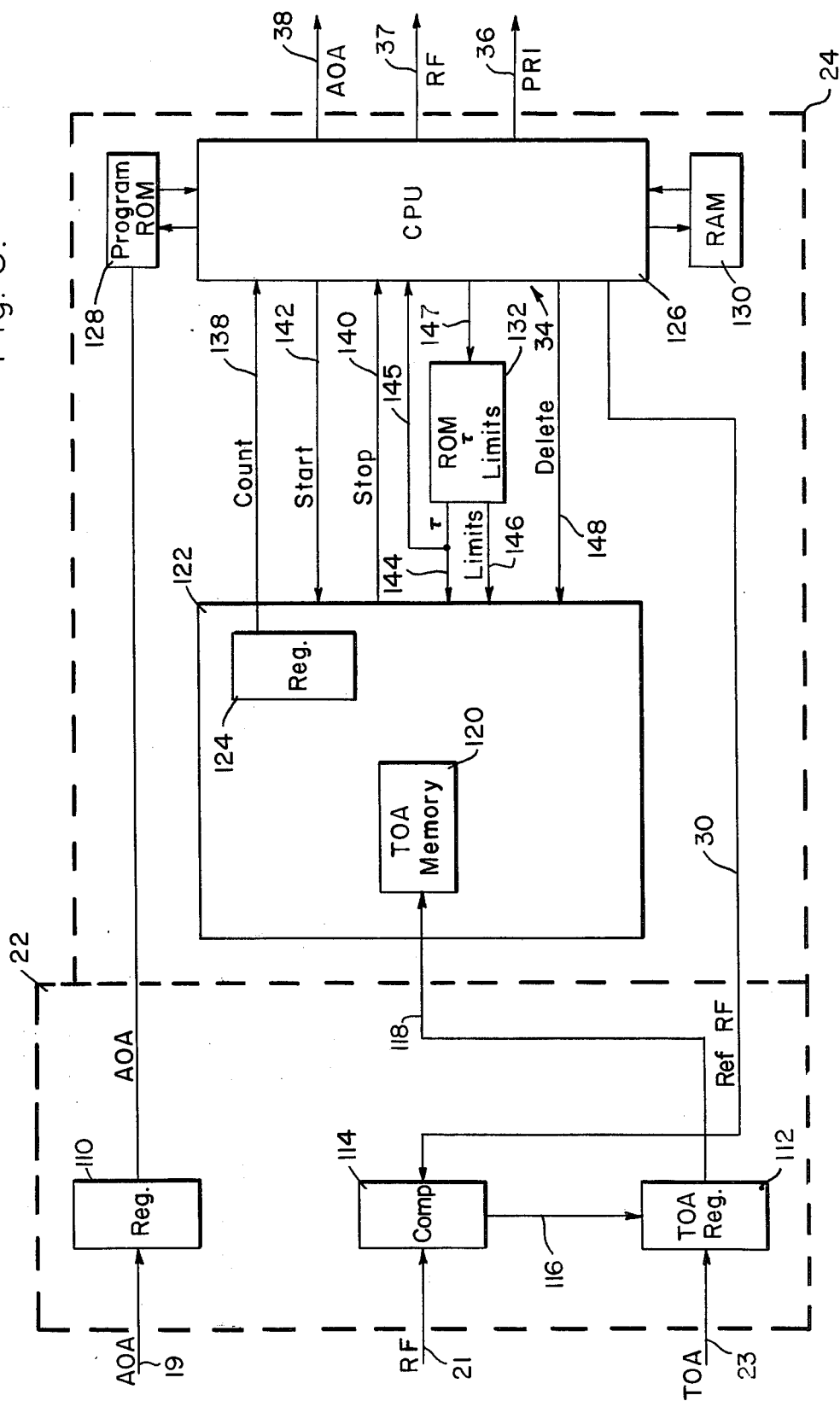
FIG. 3 is a schematic block diagram showing the TOA filter and the PRI autocorrelator including the processor, all of FIG. 1.

Referring now also to FIG. 3, the prefilter and the autocorrelator unit 24 of FIG. 1 will be explained in further detail. The prefilter 22 includes a register or delay element 110 receiving AOA on the lead 19. The TOA signal is supplied from the lead 23 to a TOA register 112 and is only passed therethrough when the measured RF on the lead 21 and a reference RF frequency on the lead 30 are matched in a comparator 114. A signal representative of a matching condition in the comparator 114 is applied through a lead 116 to the TOA register 112 to gate the TOA data through a composite lead 118 to a TOA memory 120 in a cell calculator 122 of the autocorrelator 24. Thus, the prefilter 22 functions to only pass TOA signals at selected RF frequencies during the relatively slow changing angle of arrival count. The cell calculator 122 also includes a register 124 for receiving the correlation count at the end of each correlation. The processor 34 is shown including a central processor unit 126 which, for example, may be a TI 90900 processor coupled to a program ROM (read only memory) 128, to a RAM (random access memory 130) for storing data utilized during the calculation and a ROM 132 for functioning as a look-up table for $\tau$ and the plus and minus limits. The use of a ROM for storage of $\tau$ is only illustrative and other sources such as are providing or calculating $\tau$ from equations may be utilized in accordance with the invention. The correlation count for each $\tau$ is applied from the register 124 through a lead 138 to the central processor unit 126 along with a stop signal on a lead 140 indicating to the central processor unit when a cell calculation has been completed. The central processor unit 126 applies a start signal on a lead 142 to the cell calculator 122 to start each cell calculation and the ROM 132 applies $\tau$ and the limit signals on respective leads 144 and 146 to the cell calculator 122 for use during the correlation count of each cell. The $\tau$ value on the lead 144 is also applied through a lead 145 to the central processor unit 126. The address for the look-up in the memory 132 is provided by the processor unit 126 through a composite lead 147. A delete signal is applied from the central processor unit 126 through a lead 148 to the cell calculator 122 to control the deletion or flagging of TOA data when an emitter has been detected at the fine level. The central processor unit 126 applies data signals PRI, RF and AOA on the respective leads 36, 37 and 38 to the display memory 40 at the end of each deletion operation which follows the determination of a PRI.

Figure 4A:
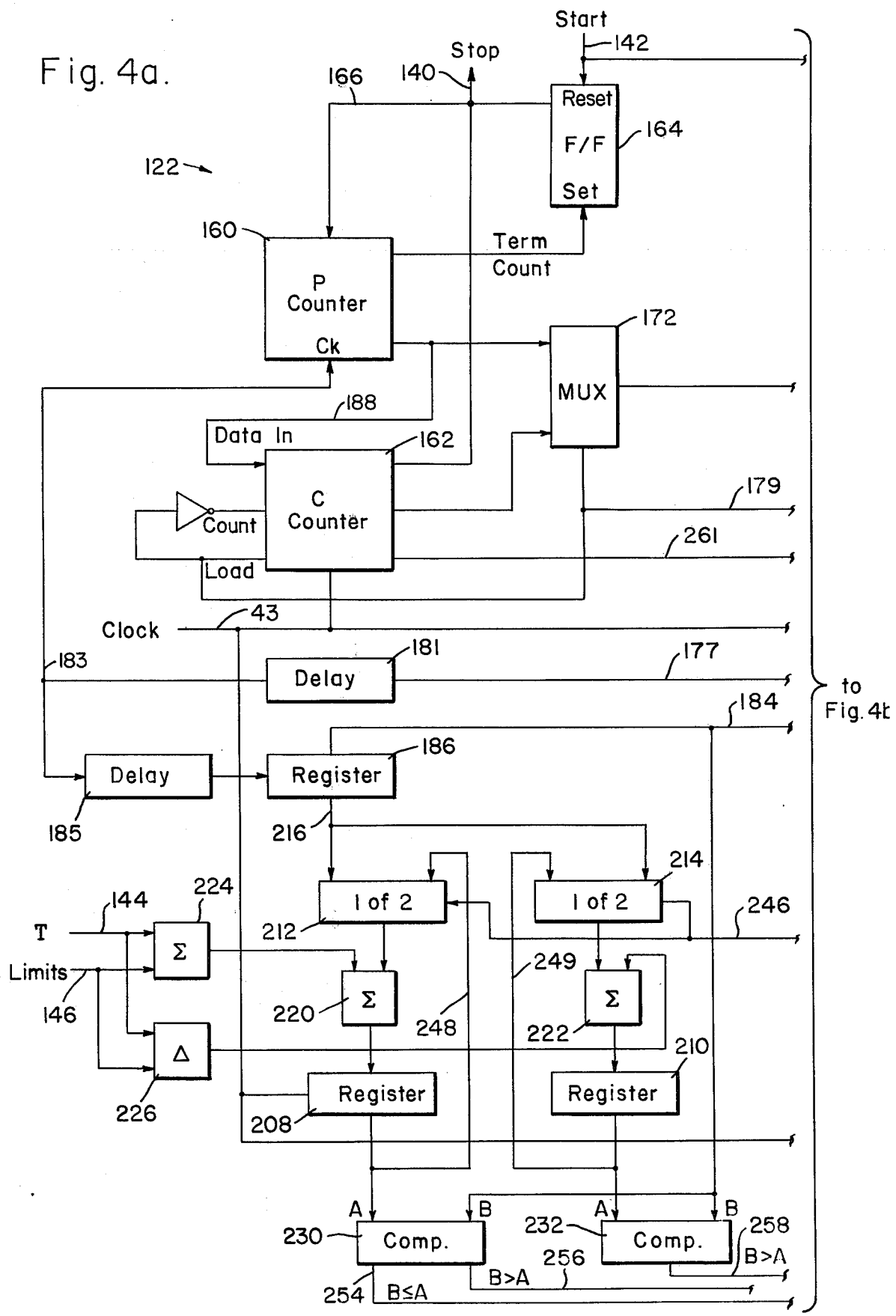
FIGS. 4a and 4b are schematic block and circuit diagrams of the cell calculator in accordance with the invention, included in the PRI autocorrelator of FIG. 3.
Figure 4B:
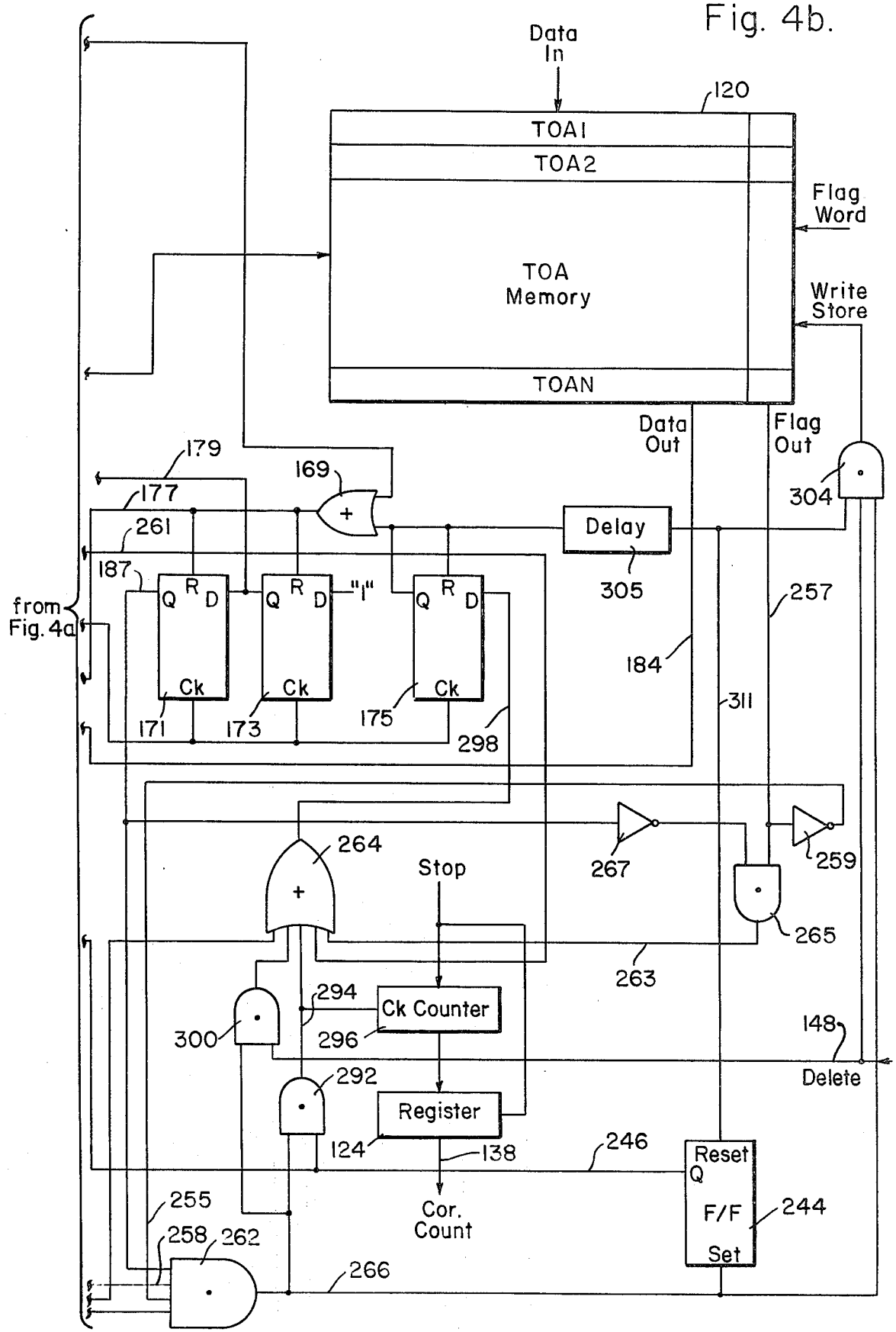

Referring now to FIGS. 4a and 4b, the illustrated cell calculator 122 includes a P-counter 160 which stores the address of a first TOA word which, when combined with an assumed periodicity value $\tau$ and incremental limit values, will be compared with other TOA words defined by the contents of a C or comparing counter 162. In response to a start signal on the lead 142, a start flip-flop 164 is reset and will remain reset until the P-counter address reaches a terminal count equal to the number of TOA words in a data set which, for example, may be 64. When the start flip-flop 164 is set, a master reset signal is applied on a lead 166 to both the P-counter 160 and a C-counter 162 for resetting those counters to zero. The master reset signal is also the stop signal applied to the central processor unit through the lead 140.

The start signal is also applied through an OR gate 169 to a lead 177 for resetting control flip-flops 171 and 173 which are coupled as a shift register with the flip-flop 173 having a "one" input. It is to be noted that a flip-flop 175 is coupled to provide a pulse during normal operation throgh the OR gate 169 in response to a terminate signal on a lead 298. The signal on a lead 179 is a "0" in the reset condition and a multiplexer 172 is set to the state to apply an address from the P-counter 160 to the memory 120. The start pulse on the lead 177 after a delay in a delay line 181 is applied through a lead 183 as a clock to the P-counter 160 to set the address to the first memory cell. The "0" state on the lead 179 loads the address through a lead 188 into the C-counter 162 at the next clock pulse on the lead 43. The first clock changes the state of the flip-flop 173 and applies a "1" to the lead 179 to change the path of the multiplexer 172 and change the C-counter 162 to the count mode. The first address from the P-counter 160 to the TOA memory 120, brings out, for example, the first TOA word TOA1 which is read out and applied through a composite data lead 184 to a holding register 186. The pulse on the lead 183 is applied through a delay element 185 to the register 186 for clocking the P data word therein. In response to the next or second clock pulse on the lead 43, the C-counter 162 counts and a "1" is applied from the flip-flop 171 to a lead 187 to energize a comparison AND gate 262. The incremented address in the C-counter is applied through the multiplexer 172 as the address of the first comparison word such as TOA2. The word TOA2 is then applied to the lead 184 to be applied to comparators 230 and 232.

The word in the holding register 186 is combined with the current value of $\tau$ and with suitable limits, i.e., an upper boundary and lower boundary, and are stored in respective upper boundary and lower boundary registers 208 and 210 in response to the first clock pulse on the lead 43. Multiplexers 212 and 214 both receive the output signals from the hold register 186 on a lead 216 and in a first state pass the contents of the holding register 186 to respective summers 220 and 222. A summer 224 receives $\tau$ on the lead 144 and a limit value on the lead 146 to apply an upper limit $\tau$ value to the summer 220. A subtractor 226 receives $\tau$ and the lower limit signal to apply a lower limit $\tau$ value to the summer 222. The upper boundary of TOA1, for example, stored in the register 208 and the lower boundary stored in the register 210 are respectively applied to comparators 230 and 232, the values being indicated as A data. The signal A derived from TOA1 is then compared with values such as TOA2 indicated as B data on the lead 184. The multiplexers 212 and 214 are controlled by the output of a match flip-flop 244 through a lead 246. The flip-flop 244 is set in response to the AND gate 262 receiving a signal B≦A from the comparator 230 on a lead and a single B>A on a lead 258, which signals represent a between limits match condition. The lead 187 prevents the gate 262 from being energized until the second clock pulse has been applied to the flip-flop 171. Also, a lead 255 coupled to a flag out lead 257 through an inverter 259 blocks the gate 262 when a flag or "one" signal is stored with an addressed TOA word.

The B>A signal on a lead 256 represents a condition where the upper limit is exceeded and the lead is coupled through an "OR" gate 264 to apply a terminate signal to the lead 298. The match flip-flop 244 is set in response to a match condition pulse applied through the gate 262 to a lead 266, to apply a control signal to the multiplexers 212 and 214 so that the signals on leads 248 and 249 are passed therethrough for a second comparison. The valve of $\tau$ and the limits are thus added to the values in the registers 208 and 210. This second comparison occurs at twice the $\tau$ value and provides a verification of a continuing match condition thereby reducing spurious single match occurrences. If the second check determines the match condition is present, the signal on the lead 266 and output of the flop-flop 244 are both "1", for example, to energize an AND gate 292 and apply a signal on a lead 294 as a clock signal to a correlation count counter 296. This correlation count is the value that will be used to detect a valid emitter. The output of the AND gate 292 is also applied through the OR gate 264 to a lead 298 as a terminate signal for energizing the control flip-flop 175 which then applies a pulse through the OR gate 169 to allow the next TOA word in memory to be stored in the hold register 186. The OR gate 264 also receives a terminal count signal on a lead 261 from the C-counter 162 and a flag out signal on a lead 263. The lead 257 is coupled to the lead 263 through an AND gate 265 also receiving the control signal on the lead 187 through an inverter 267.

For the deletion mode, and AND gate 300 is provided responsive to a match signal on the lead 266 and a delete signal on the lead 148 to pass a terminate signal through the OR gate 264. Thus, in the delete mode, the second comparison as controlled by the flop-flop 244, is not required. However, it is to be understood that this invention is not limited to single match comparisons controlling the deletion but could be extended to include two or more matches for deletion. Also, single matches for correlation or greater than double matching for correlation all are within the scope of the invention. When in the delete mode as provided by a signal on the lead 148 and upon detection of a match condition with a terminate signal on the lead 298, an AND gate 304 responds to apply a write strobe signal to write a flag word, which for example, may be a "1" into the TOA word cell being addressed by the P-counter 160. The gate 304 receives the pulse from the flip-flop 175 after being applied through a delay element 305, receives the match signal on the lead 266 and receives a delete signal from the lead 148. This deletion operation is performed on each TOA word of P data for which a match was found in a fine level cell and after establishing a threshold in the processor unit was determined to contain an emitter.

The stop signal from the start flip-flop 164 is also applied through the lead 140 to the counter 296 as a master reset pulse and as a clock signal to the correlation count register 124, which receives the correlation count to be applied to the central processor unit 126 through the lead 138. It it to be noted that the correlation count is transferred to the register 124 at the completion of a cell correlation at either the coarse or fine level, each cell correlation being for a specific $\tau$ value.

Before further explaining the operation of the cell calculator 122, the autocorrelation operation provided by the invention will be generally explained. Referring first to FIG. 5 for explaining the generation of a data set of time ordered TOA values, the pulses of a waveform 324 shows the video pulses received from emitters and provided by the receiver. As can be seen from the amplitudes of the pulses of the waveform 324, the input data may contain pulses received from three separate emitters, for example. A waveform 326 shows the clocks and the counts of the counter 106 of FIG. 2 which, for example, may start at zero and with each vertical line representing a count. The register 100 of FIG. 2 may have suitable input circuitry so that the leading edge of the emitter pulses of the waveform 324 each represents a time of arrival that is detected. Because the amplitude differences shown are for illustration of interlacing and in general are not useful in real systems, the constant amplitude pulses of a waveform 328 are shown as they represent the actual video input to the correlator system. Thus, it can be seen that each pulse of the waveform 328 provides a time of arrival or TOA value, such as TOA1, TOA2, TOA3 and TOA4, which is stored in the TOA memory and then by autocorrelation is utilized in the cell calculator to determine a PRI value for the pulses derived from each emitter. For example, pulses 329, 330, 331, 332 and 333 are all derived from the same emitter and a PRI value is derived therefrom. Similarly, the pulses 336, 337 and 338 are derived from another emitter. It can be seen that because of the different pulse repetition intervals, pulses from some emitters, such as pulses 336, 337 and 338 are walking through or changing their position in time with respect to the pulses 329, 330, 331, 332 and 333.

Figure 6:
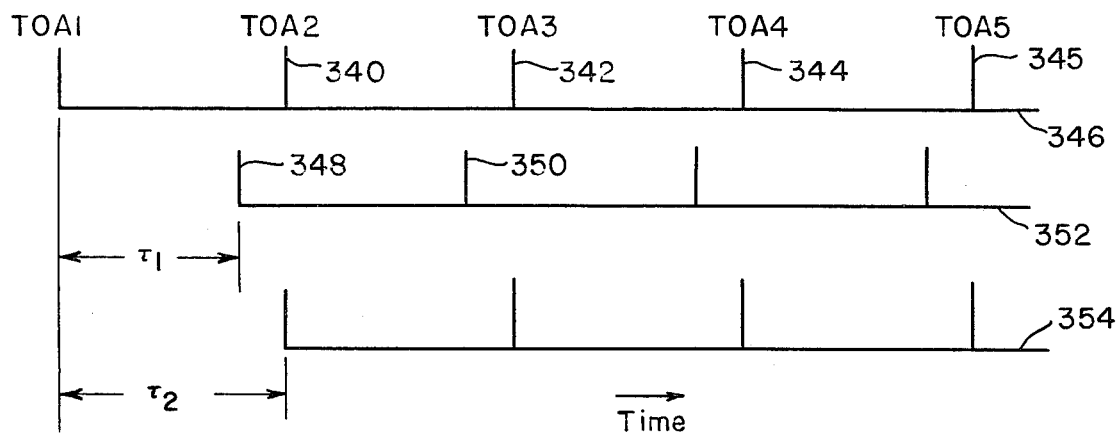
FIG. 6 is a schematic diagram showing the TOA pulses on a time scale for explaining the autocorrelation operation in accordance with the invention.

Referring now to FIG. 6, pulses 340, 342, 344 and 345 of a waveform 346 respectively respresenting time of arrivals TOA2, TOA3, TOA4 and TOA5 of pulses received from a single emitter, are shown being compared with TOA1+$\tau_1$ of a waveform 352. The pulses such as 348 and 350 do not compare or match with the TOA2 or TOA3 pulses of the waveform 346. However, when the assumed periodicity $\tau_1$ is increased to $\tau_2$ the pulses of the waveform 354 representing TOA1+$\tau_2$, TOA2+$\tau_2$, TOA3+$\tau_2$ and TOA4+$\tau_2$ do respectively match with TOA2, TOA3, TOA4 and TOA5 pulses 340, 342, 344 and 345 of the waveform 346 and four matches are detected by the cell calculator and stored as the correlation count. It is to be noted that for simplicity, the plus and minus limits of the TOA1 time values of the waveform 354 are not shown. The $\tau_2$ is the value that would be reported if the correlation count when further processed is found to be a valid emitter. Thus, it can be seen that in the autocorrelation system of the invention, when pulses of an emitter are matched with the TOA values held in the holding register, a number of counts are provided to the correlation counter such as 4 counts to be associated with the assumed $\tau_2$ value.

Figure 7:
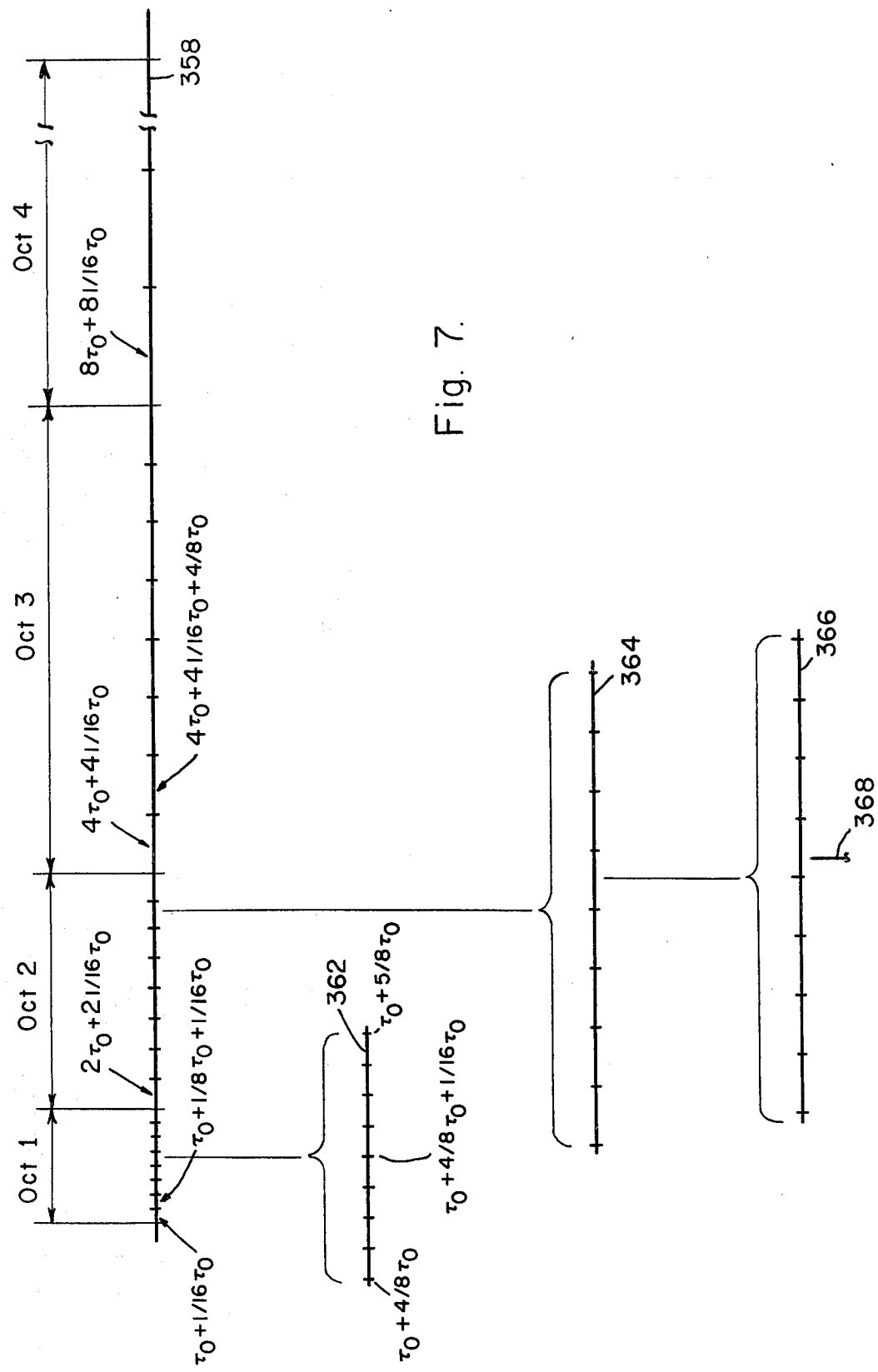
FIG. 7 is a schematic diagram on a time scale for explaining the time offset value $\tau$ and limits that may be used in the coarse level and a selected number of fine level calculations, in accordance with the invention.

Also, before further explaining the operation of the cell calculator, reference is made to FIG. 7 which shows the octaves, cells and subcells in a time scale as utilized in the autocorrelation processor in accordance with the invention. Each octave is divided into eight coarse level cells, with each cell having a predetermined value of $\tau$ with $\tau$ increasing by the integral multiple for each octave, as is illustrated for octaves 0, 1, 2 and 3. The value of $\tau_0$ may be selected at any convenient time period such as 64 microseconds on the time scale 358 and $\tau_0$ for the second coarse level all of octave 0 then equals $\tau_0 + \frac{1}{8} \tau_0 + 1/16 \tau_0$. Although each octave is divided into eight cells, it is to be understood that the invention is not limited to any particular number of divisions. For further clarity, in octaves 1 and 0, the first cell utilizes respective $\tau$ values of $\tau_0 + 1/16 \tau_0$ and $2\tau_0 + 2 \times 1/16 \tau_0$. The second cell of octave 2 utilizes a $\tau_0$ value of $4\tau_0 + 1/16\tau_0 + 4/8\tau_0$. Similarly in the octave 3, the first cell utilizes a value of $8\tau_0 + 8 \times 1/16\tau_0$. In the system of the invention, the time scale 358 represents the coarse level correlation and time scales 362 and 364 represent a fine level of correlation respectively being time expansions of the fifth cell of octave 0 and the seventh cell of octave 1 which are each then divided into eight subcells with each subcell having a separate $\tau$ value. For example, the $\tau$ of the fifth cell of octave 0 is $\tau_0 + 4/8 \tau_0 + 1/16\tau_0$, which value is the center value of the time scale 362. Thus the first subcell of the fine level of the time scale 362 has a $\tau$ value of $\tau_0 + 4/8 \tau_0$ and the eight subcell, the value $\tau_0 \frac{5}{8} \tau_0$. For a second fine level as shown by a time scale 366, each subcell of the time scale 364 may be broken up into 8 sub-subcells, each having a derived $\tau$ value. It is to be noted that also within the scope of the invention that additional finer levels indicated by dotted line 368 may be utilized. It is also to be noted that the time interval of each octave is doubled in interval or has a 2:1 time shift which is utilized in the cell calculator of the invention for detecting matching conditions with the harmonics. The PRI space for which emitters are being interrogated in the system of the invention, is determined by selecting $\tau$ and the total tme interval of the number of octaves being processed which may be 8 as in the illustrated system. It is to be understood that for purposes of this invention, the use of the word octave, as previously discussed, means a doubling of the time interval $\tau$.

The invention is not limited to the illustrated operation proceeding from a coarse to a fine level map, but immediate calculation of a multicell map at a fine level could be made and analyzed all within the scope of the invention. It is to be noted that the use of fine levels expedites the computation process. However, it is to be understood that the invention also includes cell calculations at only the coarse level to provide correlation counts at the coarse level.

The COARSE value of $\tau$ and the limits may be derived from the following equation where N is the octave number:

$$TAUC = 64 \times 2^{N-1} + 4 \times 2^{N-1} + 8 \times 2^{N-1} \times (CELL-1)$$

$$LIMIT = 4 \times 2^{N-1}$$

$$N = OCTAVE = 1, 2, 3, 4, 5, 6, \text{(etc.)}$$

$$CELL = 1, 2, 3, 4, 5, 6, 7, 8$$

The FINE value of $\tau$ and the limits may be derived from the following equation:
$$TAUF = TAUC + (\tfrac{1}{2} \times 2^{N-1})$$
$$(-7) + 2^{N-1}(SUBCELL-1)$$

$$LIMIT = \tfrac{1}{2} \times 2^{N-1}$$

To further explain the values stored in the ROM 132 and access by an address representing level, octave number, cell and subcell, the following table illustrates some of the values of $\tau$ and $\pm$ limits that may be stored at those addresses for use in the illustrated system:

| LEVEL | OCTAVE | CELL | SUBCELL | TAU, $\mu$SEC | $\pm$LIMIT, $\mu$SEC |
|---|---|---|---|---|---|
| 1 | 1 | 1 | 1 | 68 | 4 |
| 1 | 1 | 2 | 2 | 76 | 4 |
| 1 | 1 | 3 | 3 | 84 | 4 |
| 1 | 1 | 4 | 4 | 92 | 4 |
| 1 | 1 | 5 | 5 | 100 | 4 |
| 1 | 1 | 6 | 6 | 108 | 4 |
| 1 | 1 | 7 | 7 | 116 | 4 |
| 1 | 1 | 8 | 8 | 124 | 4 |
| 2 | 1 | 1 | 1 | 64.5 | .5 |
| 2 | 1 | 1 | 2 | 65.5 | .5 |

-continued

| LEVEL | OCTAVE | CELL | SUBCELL | TAU, $\mu$SEC | ±LIMIT, $\mu$SEC |
|---|---|---|---|---|---|
| 2 | 1 | 1 | 3 | 66.5 | .5 |
| 2 | 1 | 1 | 4 | 67.5 | .5 |
| 2 | 1 | 1 | 5 | 68.5 | .5 |
| 2 | 1 | 1 | 6 | 69.5 | .5 |
| 2 | 1 | 1 | 7 | 70.5 | .5 |
| 2 | 1 | 1 | 8 | 71.5 | .5 |
| 2 | 1 | 2 | 1 | 72.5 | .5 |
| 2 | 1 | 2 | 2 | 73.5 | .5 |
| 2 | 1 | 2 | 3 | 74.5 | .5 |
| 2 | 1 | 2 | 4 | 75.5 | .5 |
| 2 | 1 | 2 | 5 | 76.5 | .5 |
| 2 | 1 | 2 | 6 | 77.5 | .5 |
| 2 | 1 | 2 | 7 | 78.5 | .5 |
| 2 | 1 | 2 | 8 | 79.5 | .5 |
| 2 | 1 | 3 | 1 | 80.5 | .5 |
| 2 | 1 | 3 | 2 | 81.5 | .5 |
| 2 | 1 | 3 | 3 | 82.5 | .5 |
| 2 | 1 | 3 | 4 | 83.5 | .5 |
| 2 | 1 | 3 | 5 | 84.5 | .5 |
| 2 | 1 | 3 | 6 | 86.5 | .5 |
| 2 | 1 | 3 | 7 | 87.5 | .5 |
| 2 | 1 | 3 | 8 | 88.5 | .5 |
| . | . | . | . | . | . |
| 1 | 2 | 1 | — | 136 | 8 |
| 1 | 2 | 2 | — | 152 | 8 |
| 1 | 2 | 3 | — | 168 | 8 |
| 1 | 2 | 4 | — | 184 | 8 |
| 1 | 2 | 5 | — | 200 | 8 |
| 1 | 2 | 6 | — | 216 | 8 |
| 1 | 2 | 7 | — | 232 | 8 |
| 1 | 2 | 8 | — | 248 | 8 |
| . | . | . | . | . | . |
| 1 | 3 | 1 | — | 272 | 16 |
| 1 | 3 | 2 | — | 304 | 16 |
| 1 | 3 | 3 | — | 336 | 16 |
| 1 | 3 | 4 | — | 368 | 16 |
| 1 | 3 | 5 | — | 400 | 16 |
| 1 | 3 | 6 | — | 432 | 16 |
| 1 | 3 | 8 | — | 496 | 16 |
| . | . | . | . | . | . |
| 1 | 8 | 1 | — | 8704 | 512 |
| 1 | 8 | 2 | — | 9728 | 512 |
| 1 | 8 | 3 | — | 10752 | 512 |
| 1 | 8 | 4 | — | 11776 | 512 |
| 1 | 8 | 5 | — | 12700 | 512 |
| 1 | 8 | 6 | — | 13824 | 512 |
| 1 | 8 | 7 | — | 14848 | 512 |
| 1 | 8 | 8 | — | 15872 | 512 |
| 2 | 8 | 1 | 1 | 8256 | 64 |
| 2 | 8 | 1 | 2 | 8384 | 64 |
| 2 | 8 | 1 | 3 | 8512 | 64 |
| 2 | 8 | 1 | 4 | 8640 | 64 |
| 2 | 8 | 1 | 5 | 8768 | 64 |
| 2 | 8 | 1 | 6 | 8890 | 64 |
| 2 | 8 | 1 | 7 | 9024 | 64 |
| 2 | 8 | 1 | 8 | 9152 | 64 |

Figure 8A:
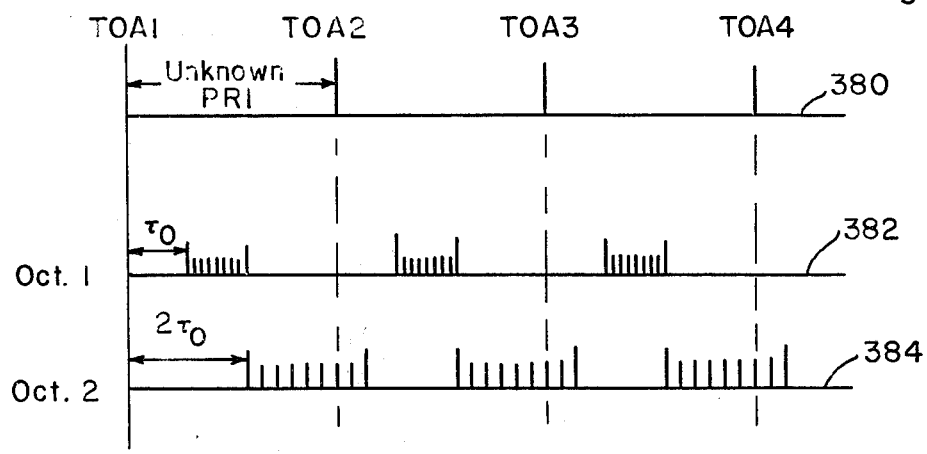
FIGS. 8a and 8b are schematic diagrams on two different time scales for explaining the effects of the octaves as defined by the $\tau$ values in determining the presence of matching conditions to identify the PRI of an emitter.
Figure 8B:
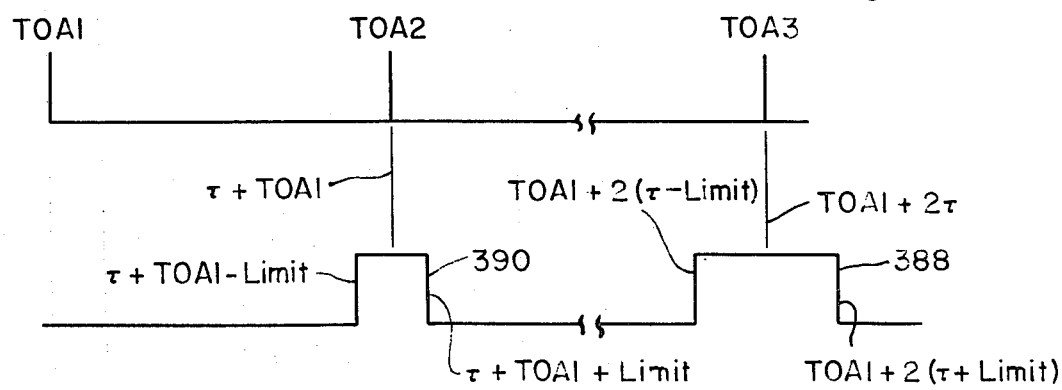

Referring now to FIGS. 8a and 8b, the matching of the cell calculator by changing to increased octave numbers will be explained relative to pulses of a waveform 380 having time values TOA1, TOA2, TOA3 and TOA4, for example, and having an unknown PRI. In octave 1, calculation is performed with a value $\tau_0$ (starting $\tau$) in the first cell and upon completion of the calculation for all the cells as shown by waveform 382 no matches are provided between TOA1 and TOA2, TOA2 and TOA3 or TOA3 and TOA4. The repetitive groups of cells of the waveform 382 illustrated the auto-correlation process where each time ordered TOA word is sequentially compared with the greater valued TOA words. At the completion of octave 1, 2 $\tau_0$ is provided for the first cell as the assumed periodicity value and octave 2 is entered, and, as can be seen by waveform 382, a match does not occur between TOA1 and TOA2 pulses, the TOA2 and TOA3 pulses and the TOA3 and TOA4 pulses of the waveform 380 until the calculation of cell number 7. As can be seen in FIG. 8b, in the match condition, TOA2 matches the time limits of a period 390 centered at $\tau$+TOA1. At a time limit 388 which is the second comparison at 2 $\tau$, the pulse TOA2 also matches because of the periodicity of the pulses of the waveform 380. The assumed $\tau$ value at the center of intervals 390 and 388, is the $\tau$ applied to the cell calculator and is associated with the correlation count.

Figure 9:
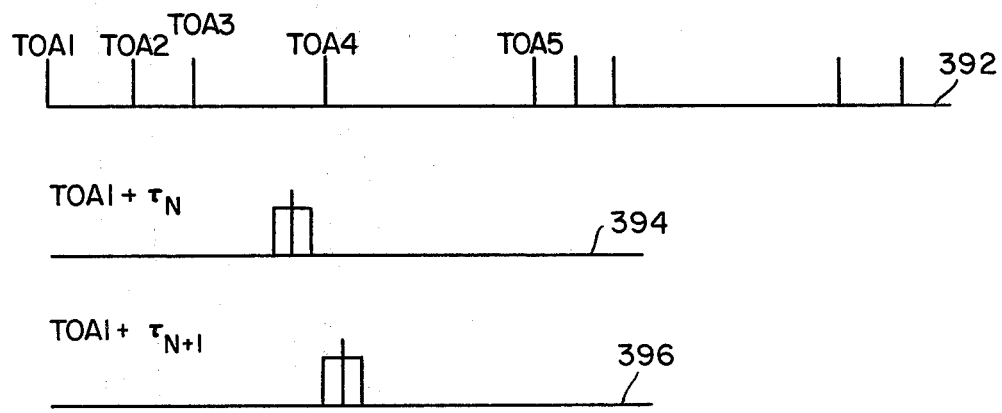
FIG. 9 is a schematic diagram of time versus amplitude for further explaining the operation of the cell calculator of FIG. 4.

For further explaining the comparison conditions of the cell calculator of FIGS. 4a and 4b, reference is now made to FIG. 9 which shows a number of TOA pulses on a time scale of waveform 392. A waveform 394 shows a time limit TOA1+$\tau$ n in either a coarse or fine level operation. Prior comparisons with TOA1 in which TOA2 is less than the lower limit and TOA3 is less than the lower limit resulted in a continuation of bringing out additional time of arrival values from the TOA memory. Upon the condition illustrated by the waveform 394, when TOA4 is compared and found to be greater than the upper limit, the value TOA1 in the holding register is replaced by the next word TOA2. However, if for example, as shown by a waveform 396, TOA1 in the holding register is combined with a larger value of $\tau$, $\tau_{n+1}$ then similarly TOA2, TOA3 are less than the lower limit and the comparison is continued. However, when the TOA4 value is compared with the time limits of waveform 396 a match condition is determined as it falls between the time limits.

Figure 10:
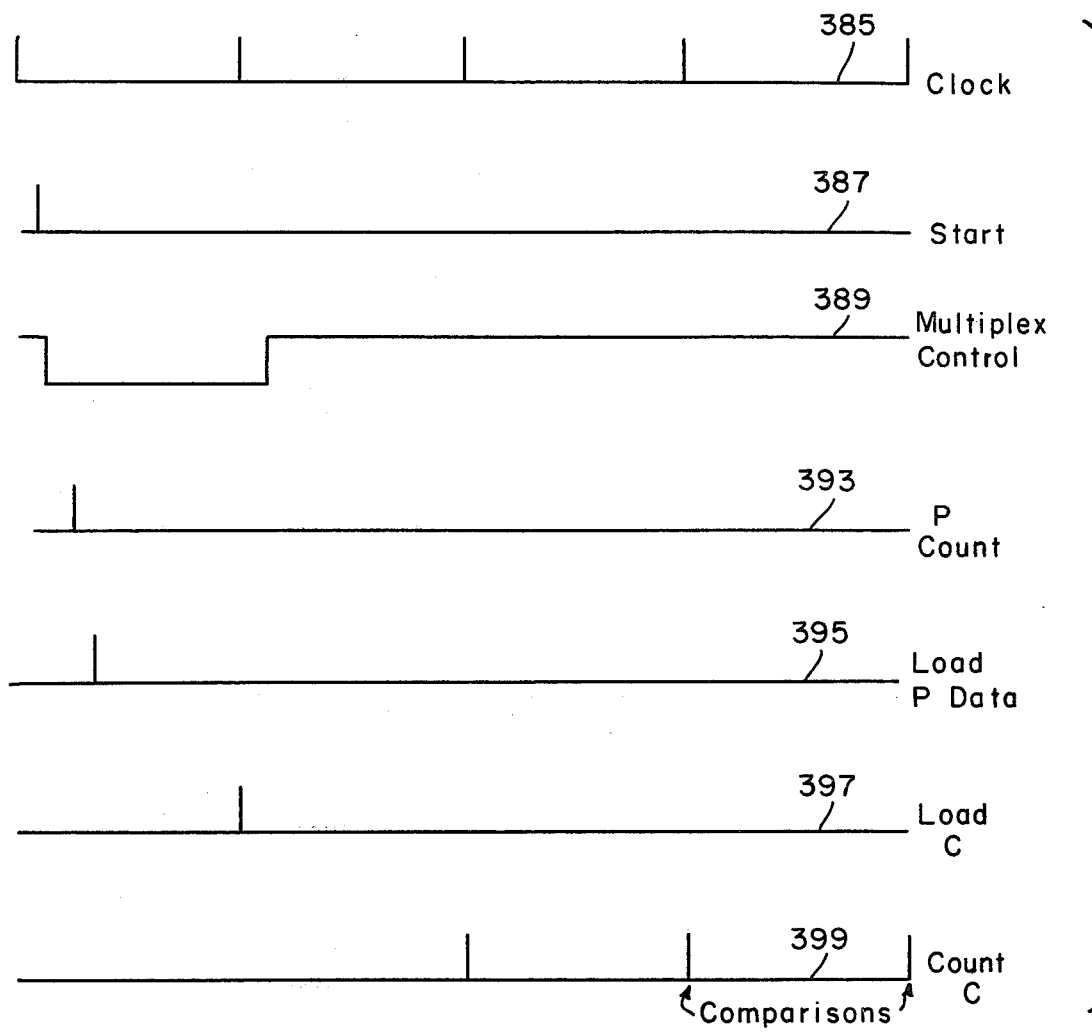
FIG. 10 is a schematic diagram of amplitude as a function of time for further explaining the timing and operation of the cell calculator of FIG. 4.

Referring now to the waveforms of FIG. 10 as well as to FIGS. 4a and 4b, a start signal of a waveform 387 occurs shortly after a clock pulse of a waveform 385 and the control flip-flops 171 and 173 are reset. The "0" level signal on the lead 179 sets the multiplexer 172 as shown by a waveform 389 so as to pass the P-counter address. The pulse on the lead 177 after the delay of the delay element 181 increments the P-counter 160 to the first P data address as shown by a waveform 393. The P-data after delay of the delay element 185 is then loaded into the register 186 as shown by a waveform 395. At the next clock pulse of the waveform 385, the P-address is loaded into the C-counter 162 as shown by a waveform 397. Also at the second clock, the registers 208 and 210 are loaded and at the next clock pulse, the C-counter is incremented, and a comparison is performed. If a match is not found, the operation proceeds to increment the C-counter and makes comparisons. Thus, when the flip-flops 171 and 173 are in the 00 states, the multiplexer changes state, the C-counter is loaded and the P-counter is incremented, in the 01 states the C-counter counts, the registers 208 and 210 are loaded and the comparison gate 262 is enabled, and in the 11 states the comparison is made.

The operation continues until the OR gate 264 applies a terminate signal to energize the flip-flop 175 and a pulse is applied to the lead 177 to increment the P-counter 160 and load the hold register 186. If in the delete mode, the pulse is applied through the delay element 305 to write a flag word or bit in the addressed P data before the P-counter 160 is incremented. The delay element 305 also applies a signal through the lead 311 to reset the control flip-flop when a flag is read out of memory the AND gate 265 provides a terminate signal at the second clock interval to read out another P-count data word. Also a match condition cannot be determined by the AND gate 262 when a flag bit is read out of memory. The operation proceeds for each P-count word until either a match is determined or the C-counter 162 reaches the terminal count. When the P-counter 160 reaches its terminal count the flip-flop 164 is reset and a stop signal is provided to the processor. The stop signal also transfers the contents of the correlation counter 296 to the register 124.

Figure 11:
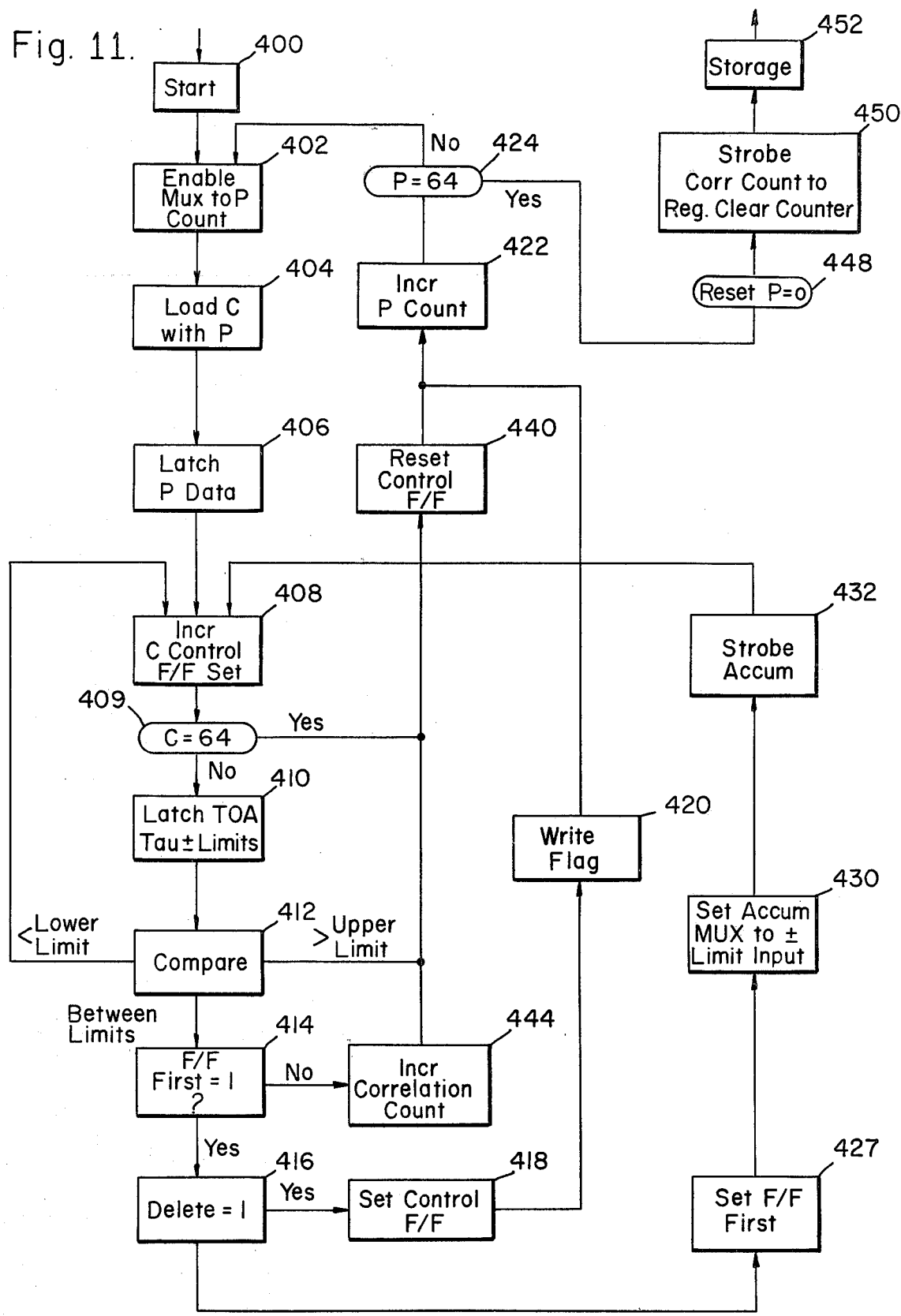
FIG. 11 is a schematic flow diagram of blocks showing the functions of the cell calculator as controlled by the processor.

Referring now to the functional flow diagram of FIG. 11 as well as to the cell calculator diagram of FIGS. 4a and 4b, the sequence of operation of the cell calculator will be explained in further detail. In response to a start pulse occurring in a block 400, the multiplexer 172 is enabled in a block 402 to pass the P-count from the P-counter 160 to the memory 120, the C-counter 162 is loaded in a block 404 with the contents of the P-counter 160 both being controlled by the control flip-flops 171 and 173. The P data is then latched into the hold register 186 as shown by a block 406. In a block 408, the control flip-flops are set and the contents of the C-counter 162 is incremented preparatory to bringing out each new TOA value of C data from memory for comparison. In a block 409, the signal on the lead 261 indicating whether a terminal count such as 64 has been developed, is checked, and if that condition is not met, the operation proceeds in a block 410 to latch the next TOA value plus $\tau$ and the limit into the upper boundary register 208 and the lower boundary register 210. A compare block 412 indicates the comparison operation and if the TOA C data being compared is less than the contents of the register 208 and is less than the lower limit, the operation of the block 408 is repeated bringing out a new comparison TOA word of C data. Each additional comparison requires an extra clock interval, for example. If a between limit comparison is determined in the block 412, and the match flip-flop 244 has been set as indicated by a block 414, the operation proceeds to a block 416 where a determination is made if the operation is in the delete mode. If a comparison is formed and the delete mode is being performed in the block 416, the flip-flop 175 is set as indicated by block 418 and a pulse is applied through the delay element 305 and a flag is then written into the present address of the memory, as is shown in a block 420. The P-counter is then incremented as shown by a block 422 and if the condition of P=64 is not met, the operation enters the block 402 where the multiplexer is enabled to the P-count.

If in the block 416, the cell calculator is not receiving a delete command on the lead 148, the operation goes to set the match flip-flop in a block 427. In a block 430, the accumulator multiplexers are set for doubling the value of $\tau$ and the limits and in a block 432, accumulator registers 208 and 210 are strobed to proceed to the operation of the box 408, which is looking for a match of the harmonic at $2\tau$. Thus, upon the occurrence of a first match in the absence of operating in the deletion mode, the operation for that cell is repeated to determine if there is a second match.

If in the comparison operation of the block 412, the compared value of C data is greater than the upper limits, the operation proceeds to provide a terminate pulse and reset the control flip-flops as shown in block 440, with the result that the P-counter is incremented in the block 422. Also, in the block 409, when the C-counter has reached its limit or terminal count of 64, a terminate signal resets the control flip-flops as indicated in the block 440. In the operation of the block 414, if the match flip-flop 244 is set to a 1, the correlation count is incremented as shown in a box 444 prior to resetting the control flip-flops in the operation of the box 440. When the P-count indicated by the operation of the box 424 is at its terminal count such as being equal to 64, the operation proceeds to reset the P-counter to 0 as indicated by a block 448. In a block 450, the correlation count is then strobed into the register 124 by the stop signal provided by the flip-flop 164 and the counter is cleared. The correlation count is then transferred to storage in the processor memory as indicated by a block 452.

Figure 12:
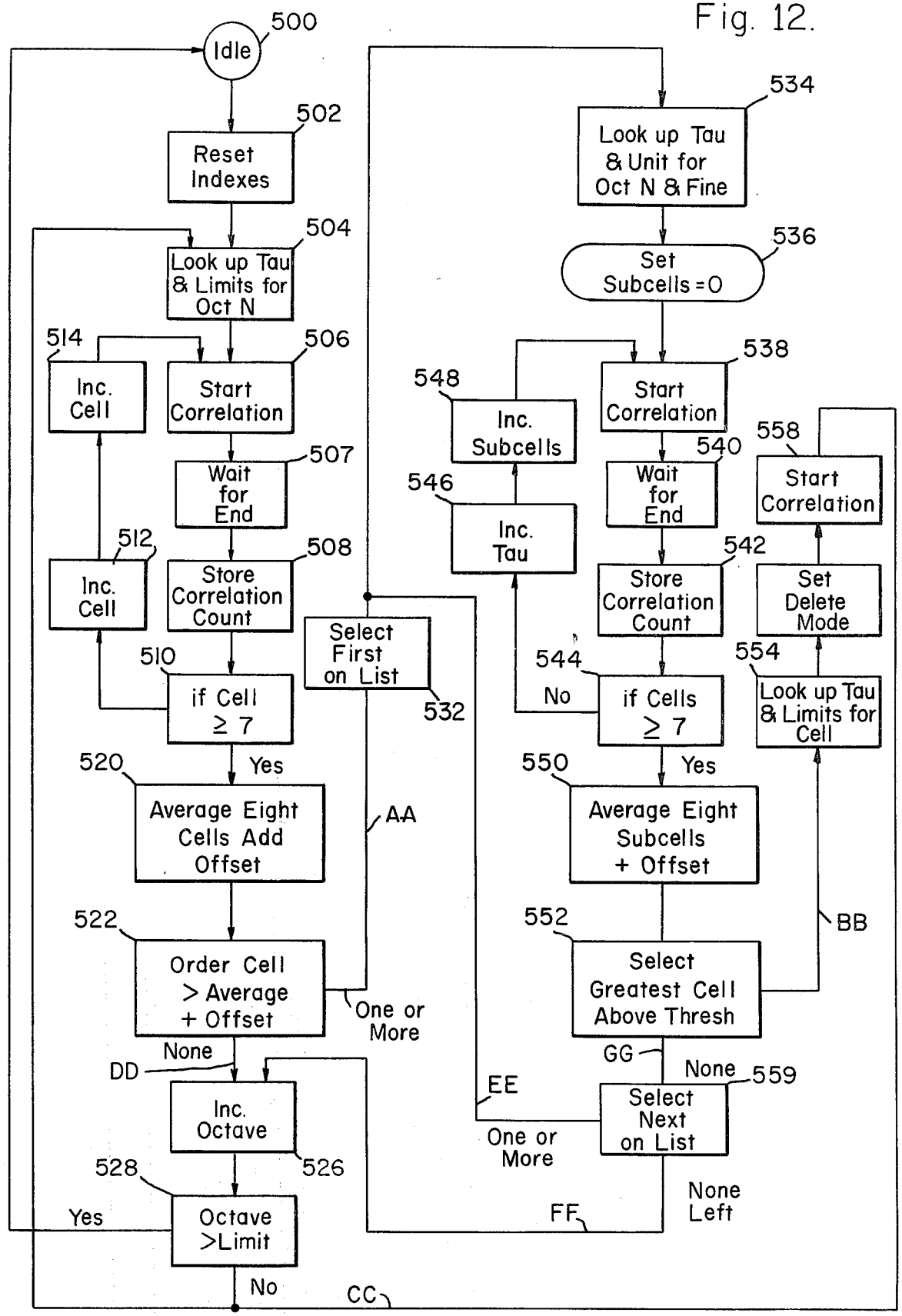
FIG. 12 is a schematic flow diagram of the general functions of the system of the invention including the processor control.

Referring now to FIG. 12 which shows a flow diagram of the central processor unit 126, the operation of the processor in conjunction with the cell calculator 122 to provide the PRI autocorrelator in accordance with the invention will be explained in further detail. At the start of the control operation, the processor may be in an idle condition as shwon by a circle 500 and then upon starting a calculation operation, goes to a block 502 for setting the octave count and other indices to zero. In a block 504, the next operation is to look up $\tau$ and the limits in the ROM 132 as shown in FIG. 3. The value of $\tau$ and the limits are a function of octave, cell, subcell and level of operation. The operation proceeds to a block 506 where the correlation is started in the cell calculator 122 by applying a start signal to the cell calculator, the $\tau$ and limits having been previously transferred or applied thereto. In a block 507, the processor waits for the end of the correlation processing or calculation and upon completion thereof as indicated by a stop signal, the correlation count for that cell is stored in the processor memory in the operation of a block 508. If the cell number, which is checked in a block 510 is not greater or equal to 7, the operation proceeds to a block 512 where the next value of $\tau$ is addressed along with the limits, which are then transferred to the cell calculator. The cell number is then incremented in a block 514 with the cell number being stored in the processor memory. The above operation represents the coarse level calculation for each cell of a particular octave and is always performed for all eight cells of an octave to form a data map prior to fine level calculations of any particular cell. Upon completion of the coarse level cell calculation, the process goes from block 510 to a block 520 where the eight correlation counts are averaged and an offset value is added to provide a threshold value indicative of whether each cell includes a signal representative of an emitter. Once the threshold is set, the operation then proceeds to a block 522 where the cells and the correlation count therein are ordered for each cell in which the correlation count value is greater than the threshold. This ordering of the cells results in a list ordered as to decreasing value, which list is then stored in a predetermined portion of the processor memory.

If the result of the thresholding and the determination in the block 522 is that there are no correlation counts in that octave greater than the average plus the offset value or the threshold, then the operation proceeds to a block 526 where the octave number is incremented and if the octave number is not greater than the limit of 7, as determined in a block 528, the operation then proceeds to the block 504 for looking up $\tau$ and the limits, a coarse level calculation is then performed for that new octave. If the octave number is greater than the limit of 7 in the block 528 the operation then proceeds to the idle condition of the circle 500 because the calculations relative to all the octaves, such as 8, have been completed for a particular data set. It is to be noted that the system of the invention is not limited to performing the calculation of all the octaves but statistical methods may be utilized to terminate the calculation when a predetermined number of the TOA data words have been flagged or deleted. It is also to be noted that the number of octaves and the $\tau$ for the first octave may be set to handle the projected environment.

When in the block 522 operation and one or more correlation counts were found to be greater than the threshold level, then the operation proceeds to a block 532. At that block the first correlation count on the list is selected and the operation then proceeds to the fine level calculation starting with a block 534 where $\tau$ and the limits are derived from the ROM 132 for the first subcell of the cell that was first on the list. In a block 536 the subcell count along with other indices are set to zero and the correlation calculation of that subcell is then performed during a period of a block 538 in response to a starting signal applied to the cell calculator. In a block 540, the processor waits for the end of the processing of that subcell and in response to a stop signal proceeds to a block 542 and the correlation count is stored in the processor memory. In a block 544, if the subcell number is not greater than or equal to 7, $\tau$ is incremented in a block 546, the subcell number is incremented in a box 548 and the correlation of the next subcell in the block 538 is then repeated. Upon the completion of the fine level computation for all of the 8 subcells the operation then proceeds to a block 550 where the correlation counts of the 8 subcells are averaged with the offset value being added thereto. In a block 552, the subcell having the greatest value is selected and if there is a cell above the threshold the $\tau$ for that cell is a valid PRI. The operation then proceeds to a block 554 where a deletion operation is performed starting with looking up $\tau$ and the limits for the subcell, proceeding to a block 556 to set the delete mode by applying a delete pulse to the cell calculator and starting the correlation in a block 558 by applying a start pulse to the cell calculator. The $\tau$ provided in the block 554 is the PRI value that is transferred to the display memory. When the correlation is complete, a stop signal is applied to the cell calculator and the operation proceeds to form a coarse calculation of that same octave by procceding to the block 504 and forming a new list or order in the block 522. Thus, it is to be noted that upon each deletion operation a coarse calculation is repeated for that octave to determine what correlation counts then remain above the threshold at the coarse level.

From the block 522, a fine level determination is formed if there are any correlation counts above the threshold and the entire operation is repeated in a similar manner. If in the block 552 there are no subcells having correlation counts above the threshold, the operation proceeds to a block 559 where if the list is not exhausted, the next cell is selected and the operation proceeds to the block 534. If the cell list is exhausted in the block 559, the operation proceeds to the next octave starting in the block 526. Thus, it can be seen that in the system in accordance with the invention, each octave is first passed through a coarse calculation and upon the determination of a correlation count above the threshold, a list is formed of the cells and a fine level determination is then performed on the first cell of the list. If the result of the fine level correlation is that a correlation count exceeds the threshold, the TOA values of P data contributing to that emitter are flanged which is effectively a deletion. The $\tau$ that was utilized for that subcell is the periodicity value that is transferred to the utilization unit as the PRI. The operation then proceeds to a coarse map or coarse level correlation to determine what correlation counts at the coarse level then remain above the threshold level and to develop a new coarse level list. If any correlation counts remain above the threshold level, the operation then proceeds to the fine level correlation until the autocorrelation is completed for that octave. The above-described operation is then sequentially completed for each octave. It is to be noted that in the illustrated arrangement, the control for a second match with a harmonic as performed by the cell calculator is not included in the processor control because this control is performed by the control structure of the cell calculator 122.

Referring now also to FIGS. 13a and 13b, the autocorrelation operation and control at the map level will be further explained along a sequential time scale. During a coarse map calculation of octave zero as shown by a time scale 562, a start pulse of a waveform 564 is applied to the cell calculator for cell zero and a $\tau$ value and a limit value of respective waveforms 566 and 568 are applied to the cell calculator from the ROM 132. Thus, the coarse level calculation of cell zero may be performed. It is to be noted that the limit value of waveform 568 is the same for each cell of the octave but that the $\tau$ value changes for each cell of the octave. At the end of the computation for cell zero, a stop signal of a waveform 570 is applied from the cell calculator to the central processing unit 126. The correlation count from the register 124 is also transferred at the end of each cell calculation to the memory of the central processor unit as shown by a waveform 574. Upon determination of a correlation count or a list of correlation counts above the threshold during the coarse level calculation, the operation then proceeds to the fine level calculation of the cell having the largest value above the threshold, which is illustrated for cell 3 of map octave zero. Correlation counts, as shown by the waveform 574, are then provided for each of the subcells 0 to 7 of cell 3. It is to be noted that a new limit value as shown by the waveform 568 is utilized for the cell 3 fine level calculation. In the illustrated example, the subcell 4 is found to have a correlation count of a maximum amplitude and a delete pulse of a waveform 578, along with a flag signal of a waveform 580, are applied to the cell calculator so that a flag operation is performed in the delete mode. The waveform 580 indicates the period during which a flag is written into all P-count data for which a match is found. The delete mode is along path BB of FIG. 12. The coarse map operation for octave zero is then performed transferring the operation along a path CC of FIG. 12 to again make the determination if any correlation counts remain above the threshold and to form a new coarse level list. The calculations of illustrated octaves 0 and 1 did not locate any cells above the threshold and the operation passes through a path DD of FIG. 12. As a result of the coarse calculation of octave 2, a coarse level correlation count was developed greater than the threshold, and the operation proceeds along path AA to the fine level computation for cell 4.

In the illustrated example, it is assumed that no subcell provided a correlation count greater than the threshold for cell 4, and the operation proceeds along the path EE to a fine level computation for the cell 2 of octave 2 which is the next cell on the ordered list. It is then assumed that in the fine computation, subcell 7 provides the largest correlation count above the threshold and in response to a delete pulse of the waveform 578, a deletion operation is performed for subcell 7. Upon completion of the deletion operation, the coarse map calculation for octave 2 is again performed with this calculation being followed by a fine map calculation of cell 4 of octave 2. This last calculation did not provide any correlation counts above the threshold. Thus, the calculation proceeds along path FF to develop a coarse map of octave 3, with the operation then proceeding until all of the octaves have been completed and cleared for that set of TOA data.

Figure 14:
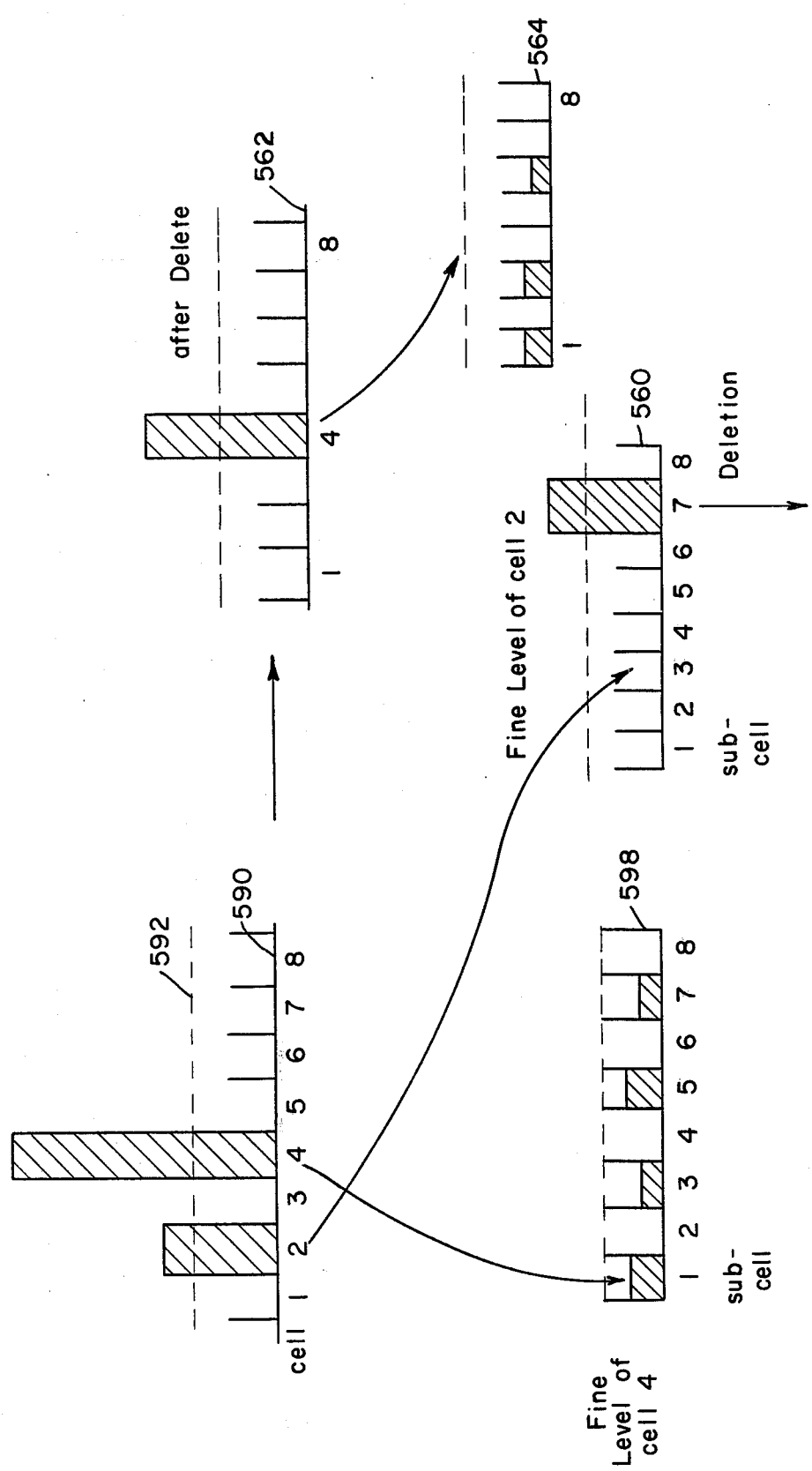
FIG. 14 is a schematic diagram of data in the cells of an octave illustrating a portion of the timing diagrams of FIGS. 13a and 13b to further explain the coarse and fine level correlations and a fine level subcell deletion operation.

Referring now also to FIG. 14 as well as to FIGS. 13a and 13b, the coarse and fine level operation of a portion of the illustrated example will be explained in further detail. A diagram 590 shown the coarse level calculation and detection of correlation counts above a threshold 592 for cells 2 and 4 as shown by a coarse level map for octave 2 during an interval 594 of FIG. 13a. Because the cell 4 has the largest amplitude the fine level computation is then performed for that cell and as shown by a diagram 598, none of the subcells have a correlation count equal to the threshold value. Thus, a fine level computation is performed for cell 2 which is next on the ordered cell list, and, as shown by a diagram 560, the correlation count in subcell 7 exceeds the threshold and the deletion operation is performed. After completion of the deletion operation, the coarse level map of octave 2 is again developed as shown by a diagram 562 and only in cell 4 is a correlation count provided, which count exceeds the threshold. A fine level map calculation is then performed for cell 4 as shown by a diagram 564. The results indicated by the diagram 564 show that none of the subcells of cell 4 have a correlation count that exceeds the threshold and the operation then proceeds to the next octave. Thus, it can be seen that after each deletion operation a coarse computation is performed to again determine whether emitters are indicated. The input signals are subject to jitter and to time positions relative to the cell and subcell intervals which may be divided between adjacent intervals, so that removal of some TOA values may substantially change the coarse level correlation.

Figure 15:
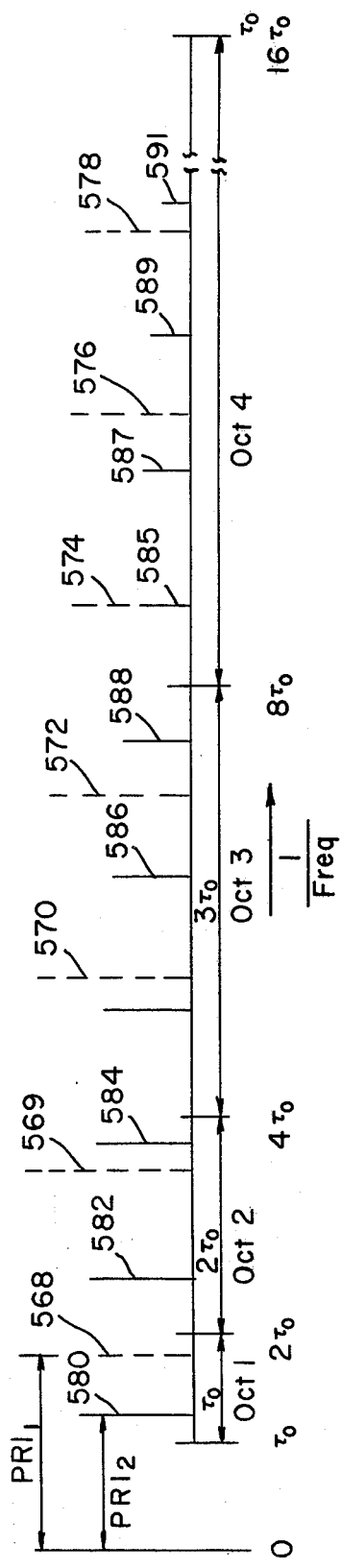
FIG. 15 is a schematic diagram of the reciprocal of frequency versus amplitude for further explaining the fundamental and harmonic signals provided by the autocorrelation process utilized in the system in accordance with the invention.

Referring now to FIG. 15 a diagram is shown of amplitude as a function of the reciprocal of frequency for further explaining the octaves and their corresponding $\tau$ values. Only the major spectral lines are shown in this diagram and the results of any cross correlations are omitted. Signals provided by an emitter and illustrated with dotted lines, includes a fundamental signal shown by a line 568 in octave 1, a harmonic line 569 in octave 2, harmonic lines 570 and 572 in octave 3 and harmonic lines 574, 576 and 578 in octave 4. Signals provided by another emitter and illustrated with solid lines, includes a fundamental signal shown by a line 580 in octave 1, harmonic lines 582 and 584 in octave 2, harmonic lines 586 and 588 in octave 3 and harmonic lines 585, 587, 589 and 591 in octave 4. The system of the invention provides reliable emitter detection by utilizing the time ordered data set and completing the processing of each octave before leaving that octave and proceeding to the next octave and by flagging or deleting the TOA words that contributed to the detection of emitters in that octave. By first processing the fundamentals and then flagging the TOA words that contributed to an emitter, the PRI values are substantially independent of missing pulse. The system of the invention is not limited to octave divisions or coarse map periods but may utilize suboctaves for the coarse map periods. Also, the system in accordance with the invention may utilize greater than octave time divisions, although with these divisions, all fundamentals may not appear in the first time division.

Figure 16A:
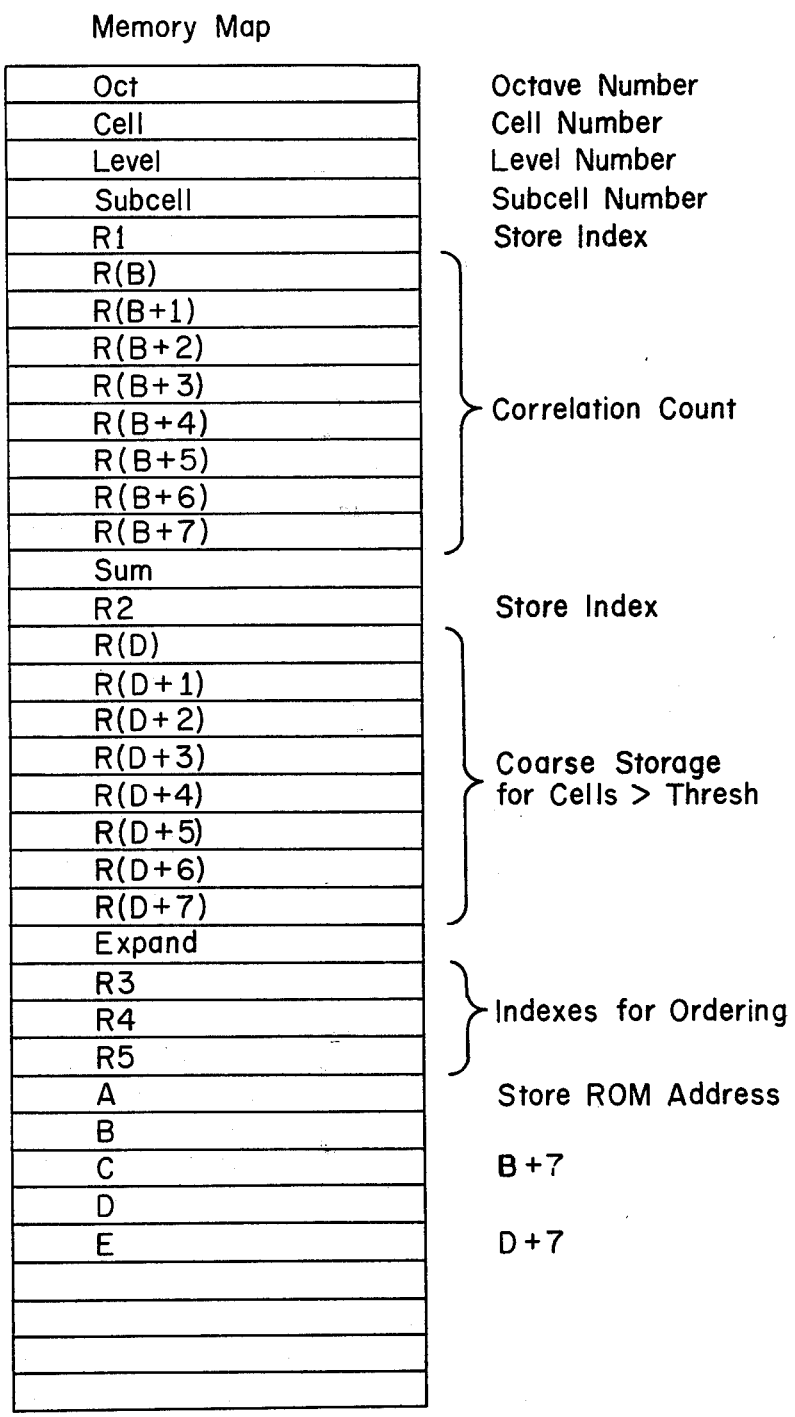
FIGS. 16a and 16b are schematic diagrams illustrating a memory map of the random access memory that may be utilized with the processor for providing the system PRI determinations and for displaying the signals.
Figure 16B:
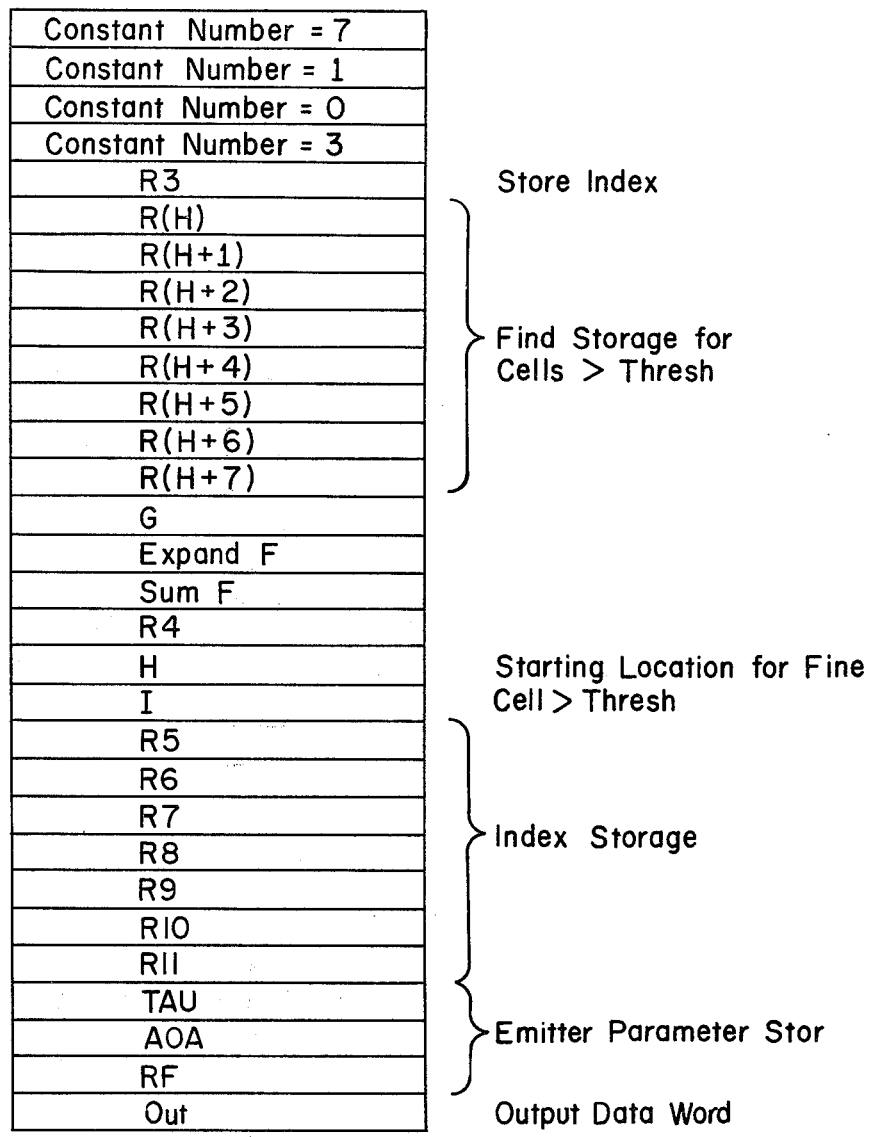
Figure 17:
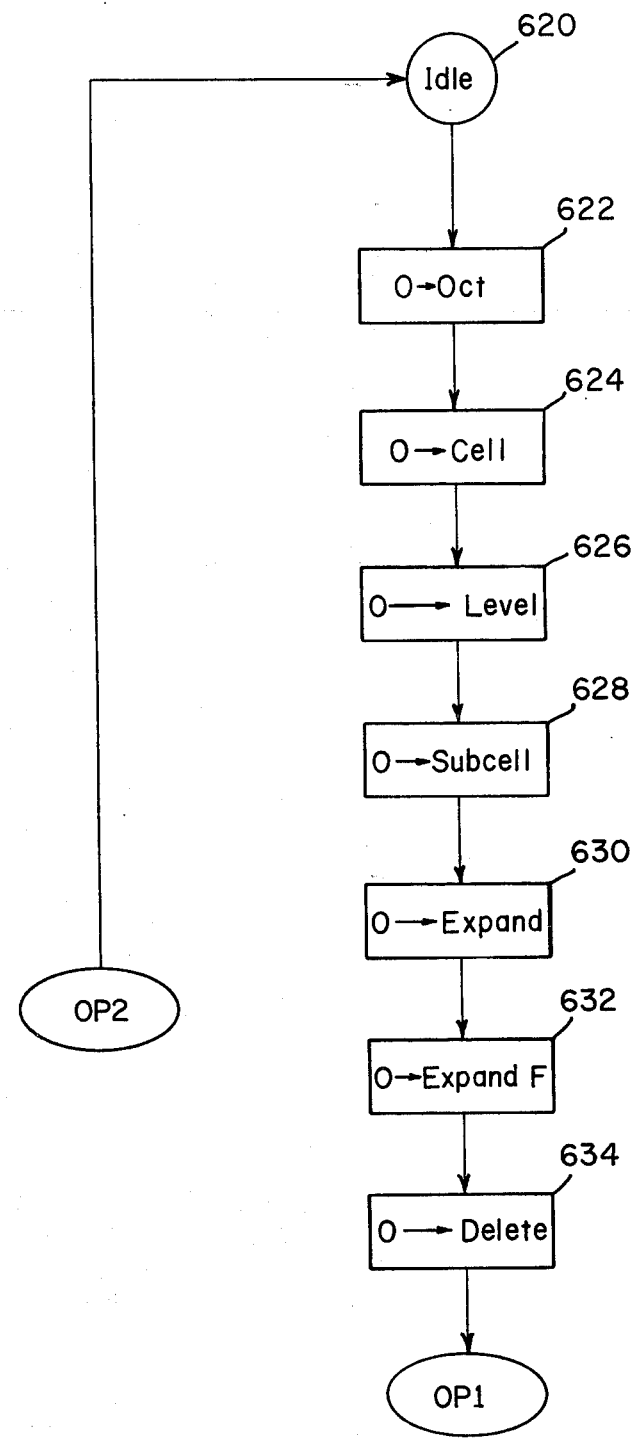
FIGS. 17–21 and 23–33 are schematic flow diagrams showing in further detail an example of the processor PRI determination of FIG. 12.
Figure 18:
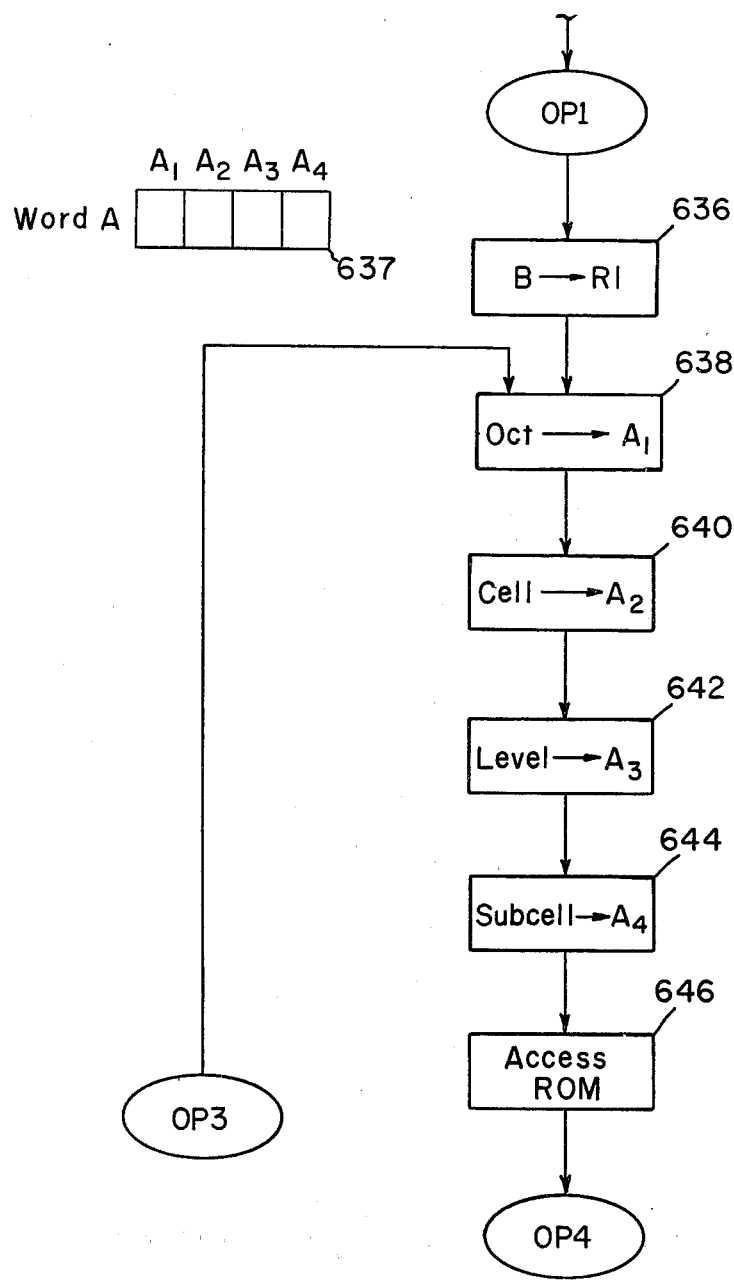
Figure 19:
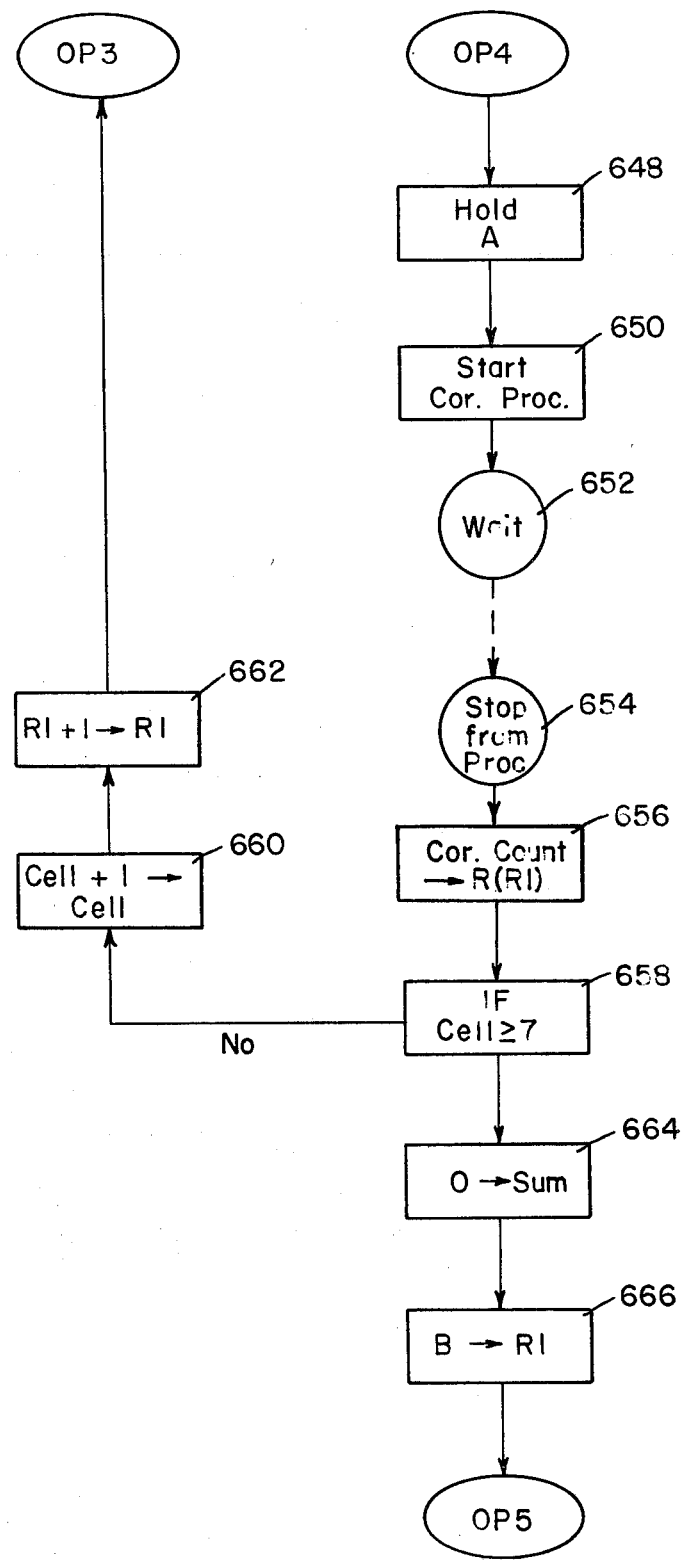
Figure 20:
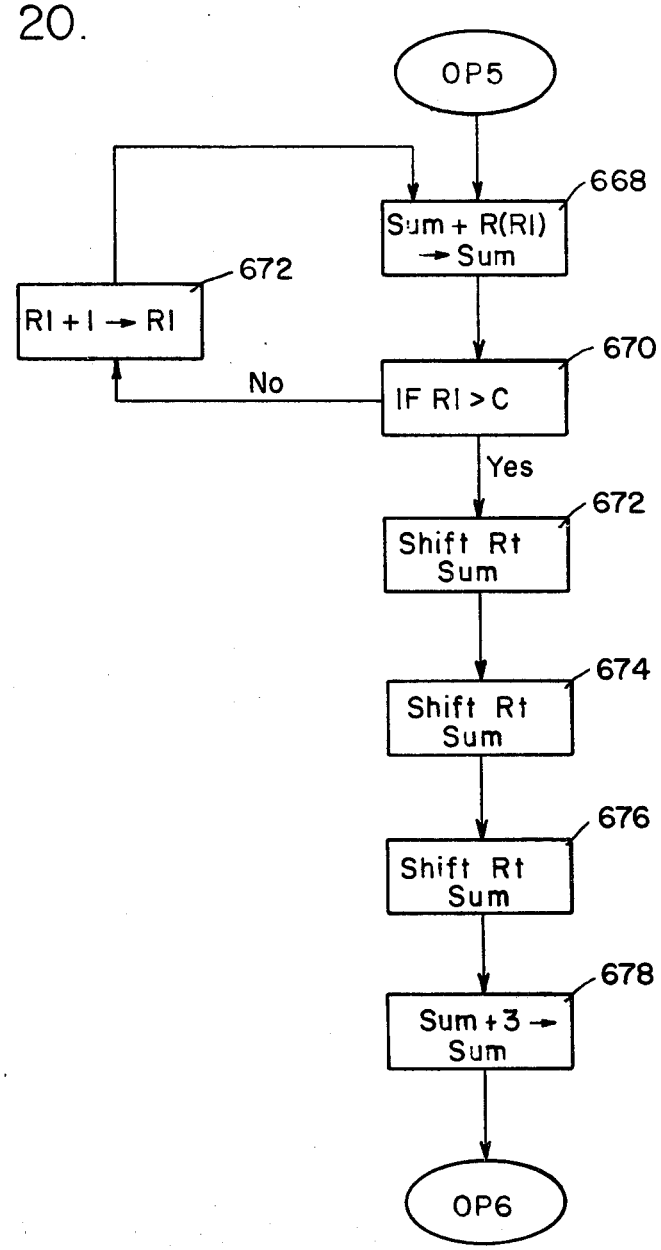
Figure 21:
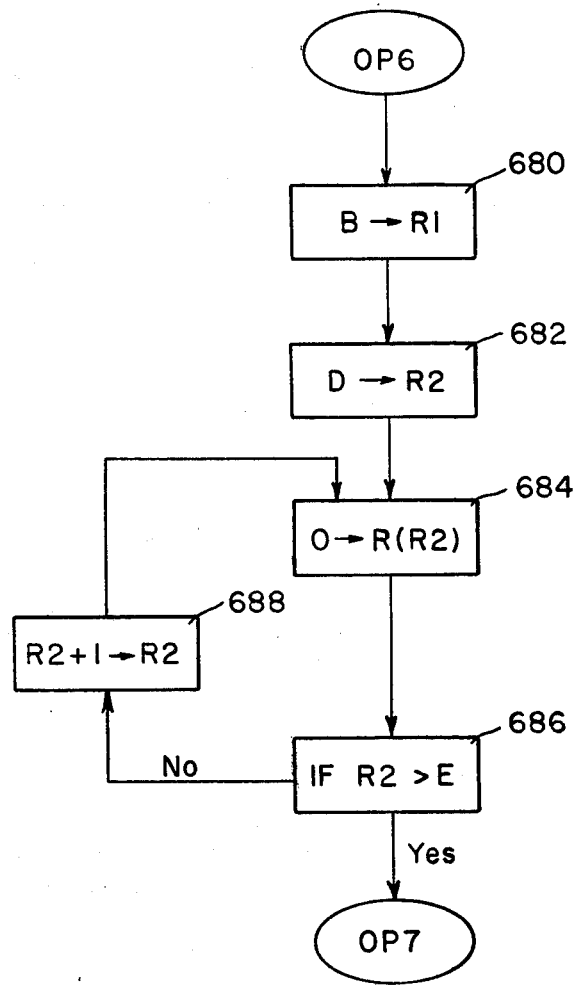
Figure 23:
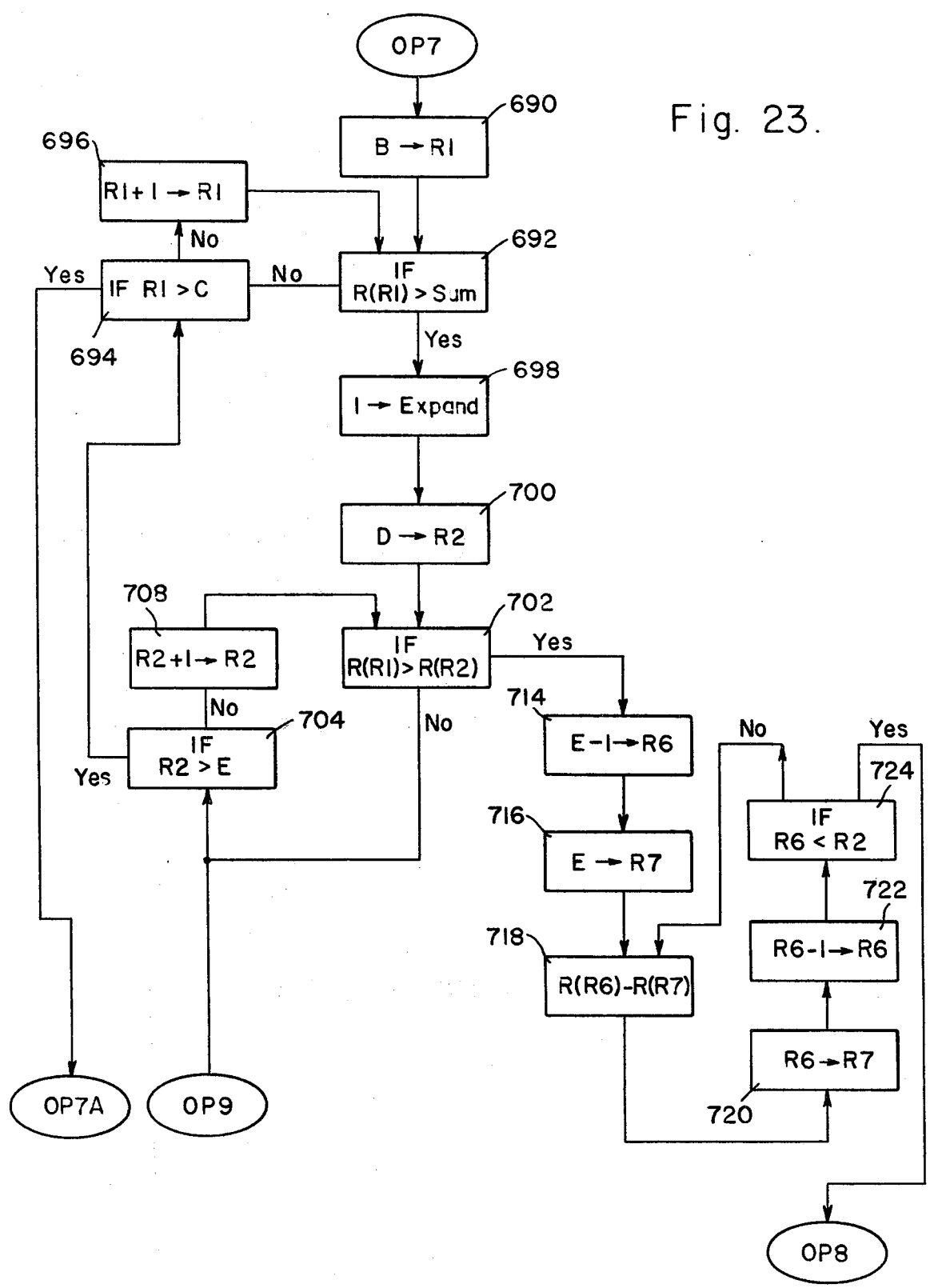
Figure 33:
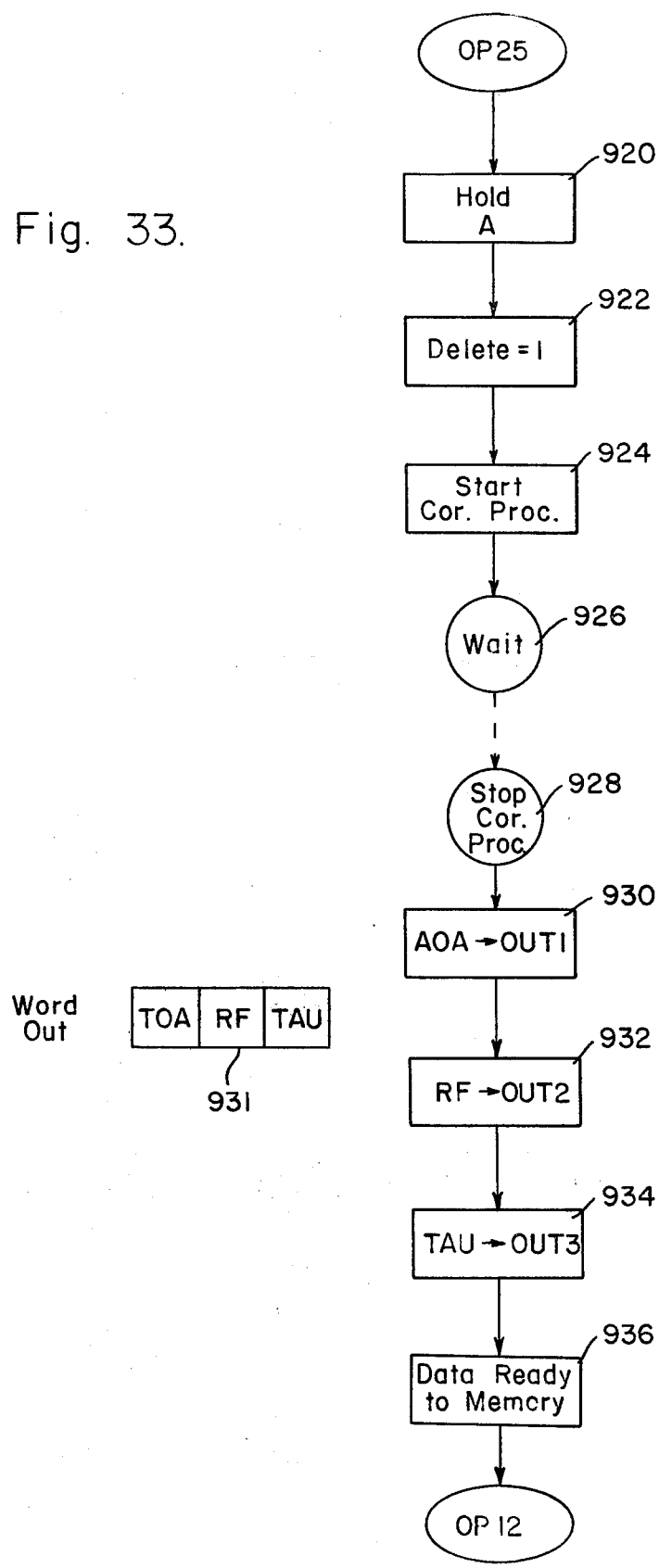

Referring now to FIGS. 16a and 16b, the memory map for the RAM 130 of the processor 24 of FIG. 13 will be explained before proceeding to a detailed flow diagram for the processor in accordance with the invention. The memory map shows the addresses or memory positions of registers for storage of values including an index register R1, correlation count storage registers R(B) - R(B+7), coarse storage registers R(D) - R(D+7) for cells greater than threshold, a register R2 for storing the index for a list of cells greater than threshold at the coarse level, registers R(H) - R(H+7) for storage of cells greater than threshold at fine level, register R3 for storage of an index for cells greater than threshold at fine level, and emitter parameter storage registers. For clarity, in certain registers, the register contents and register name have the same designation. The memory map is an illustrative diagram of a suitably organized memory 130 that may be utilized with a processor unit such as a TI 9900 processor for the central processor unit 126 of FIG. 3. It is to be understood that FIGS. 17 and 33 shows an illustrative flow diagram that may be utilized to carry out the principles of the invention, and that the invention includes variations of the steps of the diagram that may be utilized to conform to requirements of any particular processor unit that may be utilized. The illustrated flow diagram may be utilized to program any of a plurality of processors by utilizing conventional techniques, as are well known in the art.

From a processor idle state of a circle 620 the RAM 130 is first initialized before the correlation operation further proceeds by resetting the OCT, CELL, LEVEL, SUBCELL, EXPAND, EXPAND F and DELETE values in respective blocks 624, 626, 628, 632 and 634. In a block 636, a constant B in the B register or cell is stored in the R1 address which is the pointer register for the correlation count storage. The value B is the starting address of the first correlation count storage register which is the R(B) register. The next operation is the look-up of $\tau$ by assembling an address word A for the ROM 132 illustrated as a word block 637 and including portions $A_1$, $A_2$, $A_2$ and $A_4$. In a block 638 the octave number OCT is stored in the $A_1$ position, in a block 640 the cell number CELL is stored at the $A_2$ position, in a block 642 the level number of LEVEL is stored at the $A_3$ position and in a block 644 the subcell number SUBCELL is stored at the $A_4$ position. The address for the ROM being thus assembled, that memory is accessed in a block 646 and the value of $\tau$ and the limits are applied to the cell calculator. In a block 648, the contents of cell A are stored or maintained on the leads to the cell calculator 122, in a block 650 the correlation process is started by providing a start signal to the cell calculator (FIGS. 4a and 4b) and in a circle 652 a wait condition is entered. When a stop signal is received from the cell calculator indicated by a circle 654, the correlation count from that cell is then stored in the register pointed to by the address in the R1 register which initially is the B address. It is to be noted that for each of the eight cells in an octave, the correlation count is stored in a different one of the registers R(B) - R(B+7). In a block 658 if the cell number is not greater than or equal to 7 the operation then proceeds to a block 660 where CELL is incremented in the A register to change the value of $\tau$ derived from the ROM. The pointer register R1 is then incremented in a block 662 so that the correlation count for the incremented cell is stored in the R(B+1) register. The operation then proceeds from the block 662 to the block 638 in order to repeat the coarse correlation for the next cell of that octave.

If in the block 658, the cell number is greater than or equal to 7 the coarse octave is completed, and the operation proceeds to a block 664 where the sum cell is reset to zero for starting the threshold calculation. In a block 666 the constant in the B cell which is the starting address of the correlation count storage, is transferred to the pointer register R1. In a block 668 the sum of the correlation counts in the SUM register is added to the value in the correlation count register being pointed to, and the sum of the two is stored in the SUM register. In a block 670, if R1 is not greater than C or (B+7) which indicates the last correlation count register, the pointer R1 is incremented in a block 672 and the summing of block 668 is again performed. When R1 is greater than C in the box 670 indicating that the total sum has been accumulated, the operation proceeds to blocks 672, 674 and 676 in serial order, where the sum value is shifted right three places to effectively divide by 8. In a block 678, the offset is added to the average value so sum +3 is stored in the SUM register which represents the threshold to be utilized for that coarse octave calculation. In the next operation of a block 680, the contents of register B are transferred to register R1 for resetting the pointer or index. The data in cell D, which is a constant representing the address of the first register for storing cells greater than threshold, is then transferred in a block 682 to cell R2, which cell is the pointer register for the group of coarse level cells greater than threshold.

Prior to ordering the correlation counts that exceed the threshold, the contents of the pointer register R2 are incremented 7 times so that the 8 greater than threshold storage cells R(D) - R(D+7) are reset. This resetting is performed in blocks 684, 686 and 688 so that an ordered list can be formed in those storage cells. The register E contains a constant number E or D+7 representing the address of the last register for cells greater than threshold. After the zeroing of this portion of memory, the operation proceeds to a block 690 and the starting address of the correlation count in cell B is stored in cell R1 to point to the first correlation count. The ordering is then performed starting in a block 692 where a determination is made if the value in the first correlation count register defined by the address of pointer R1, is greater than the threshold in the SUM register. If the correlation count R(R1) is not greater than the threshold, the operation proceeds to a block 694 to check the value of the painter relative to C which is the address of the bottom of the correlation count store. If the last cell of the correlation registers has not been accessed, the contents of register R1 is incremented by 1 in a block 696 and the operation returns to the block 692.

If the result of the block 692 decision is yes, the operation proceeds to a block 698 which is the start of the ordering and a 1 is stored in the EXPAND register which is a flag indicating that a greater than threshold value has been detected and the operation will subsequently proceed to the fine level. The constant in cell D, which is the starting address for greater than threshold storage, is then transferred to the cell pointer register R2 in a block 700. If in a block 702, the contents or correlation count of the register defined by the address in the cell R1 is not greater and the contents of the fifth position of the register defined by the address in the cell R2, which contains the correlation count for greater than threshold cells, the operation proceeds to a block 704. The values to be stored in the storage registers for COARSE cells greater than threshold at address R2 are shown by a word block 710 with the fifth position storing the correlation count. In the block 704, if the contents of the cell R2 are not greater than the contents of E which is the number D+7, the operation proceeds to a block 708 where the contents of the register R2 are incremented. The operation then returns to the block 702 to determine if the correlation count as located by pointer R1 is greater than the fifth position of the next value on the list of the coarse storage cells greater than threshold. If in the block 704 the bottom of the list pointed to by R2 is reached, the operation proceeds to the block 694. As shown by the block 710, in addition to the fifth position of the data in the cell defined by the address of the cell R2 being the correlation count, the first, second, third and fourth positions of the data in that cell are respectively octave number, level number, cell number and subcell number.

When in the block 702 a determination is made that the correlation count as defined by pointer register R1 is greater than the correlation count that is greater than threshold as defined by the pointer register R2, the operation proceeds from block 702 to a block 714, starting the operation of storing the correlation count in the proper position of the list. In the block 714, E - 1 is stored in the R6 register which functions as a pointer register. In a block 716 the E constant is stored in the R7 register. During the operation of a block 718, the correlation count pointed to by the pointer R6 is stored in the R7 register, that is if the next to last correlation count greater than the threshold is moved down on the list. The operation then proceeds to a block 720 where the address word in the cell R6 is transferred to the cell R7 followed by a block 722 where the value R6 - 1 is transferred to the cell R6. In a block 724 if the data in cell R6 is not less than the data in cell R2 the operation returns to the block 718. If, during this operation, the value in cell R6 is less than the value of cell R2, then the operation proceeds to a block 728 where the octave number in the cell OCT is transferred to the register whose address is (R2)$_1$. In a block 730 the contents of the cell LEVEL are transferred to the second position of the data word R(R2), in a block 732 the contents of CELL are transferred to the third position of the cell R(R2), in a block 734 the contents of SUBCELL are transferred to the fourth position of the cell R(R2) and in a block 736 the correlation count tested in the block 702 is transferred to the fifth position of the cell R(R2). At the termination of the operation of block 736 the control then returns to block 704 and the ordering continues.

Figure 22:
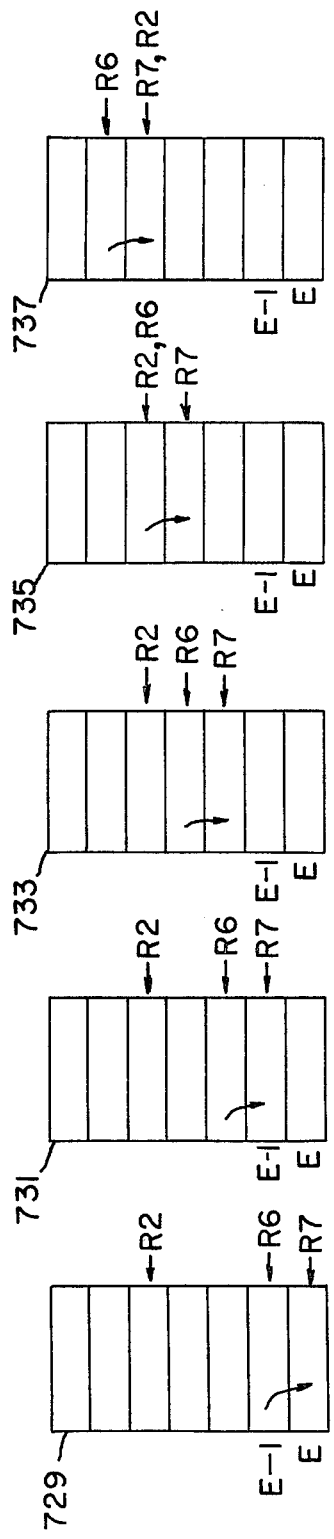
FIG. 22 is a schematic diagram for further explaining the ordering operation utilized in the flow diagrams.
Figure 24:
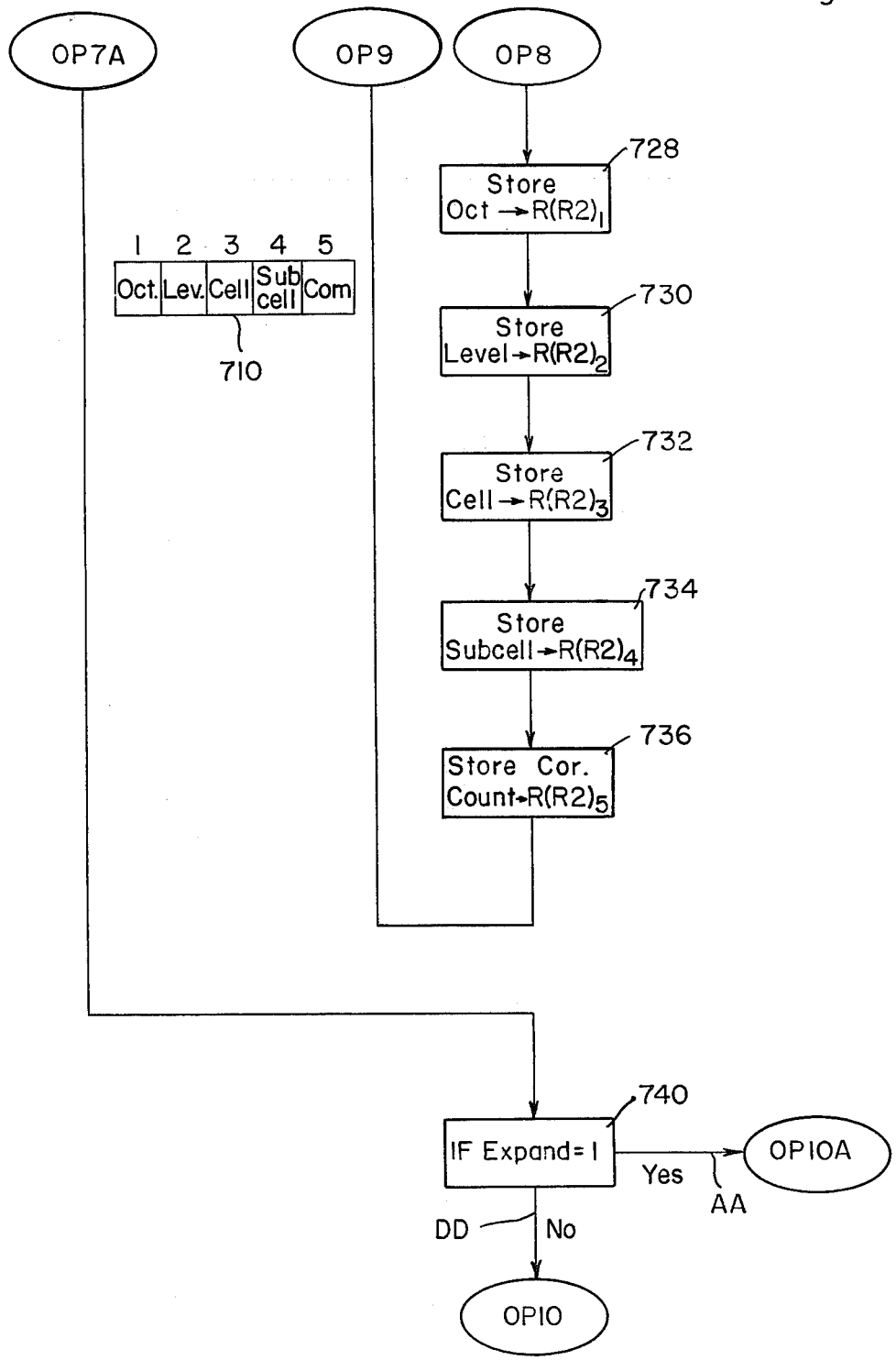
Figure 25:
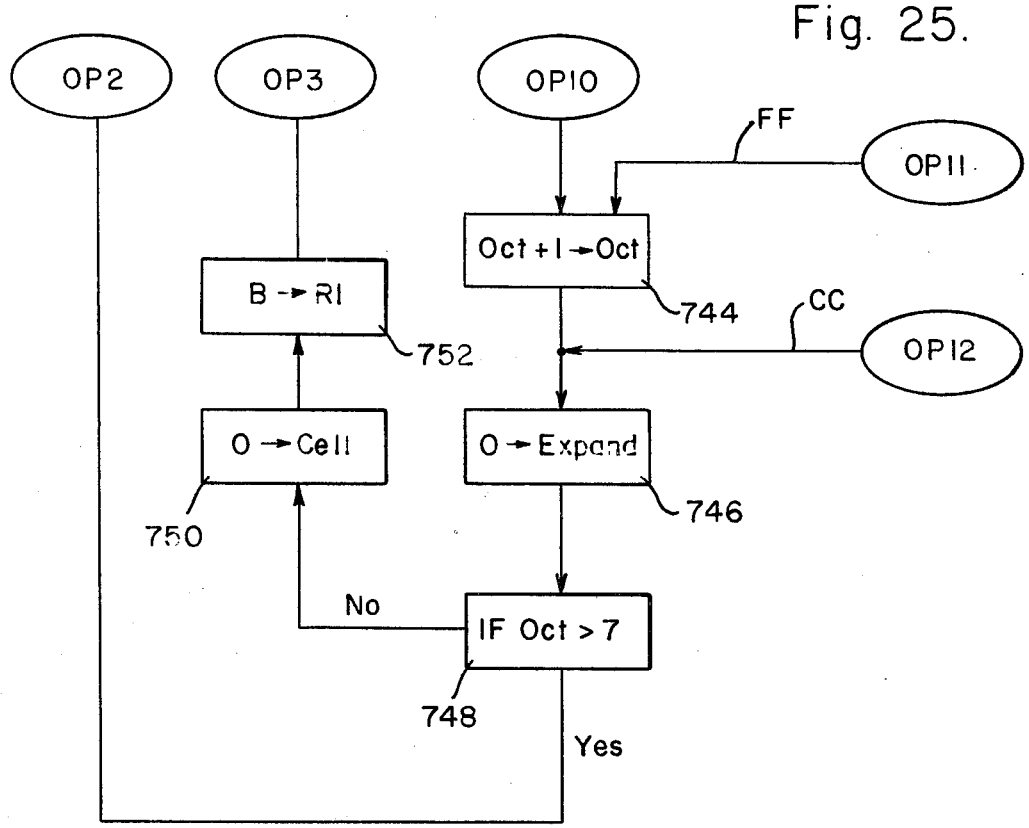
Figure 26:
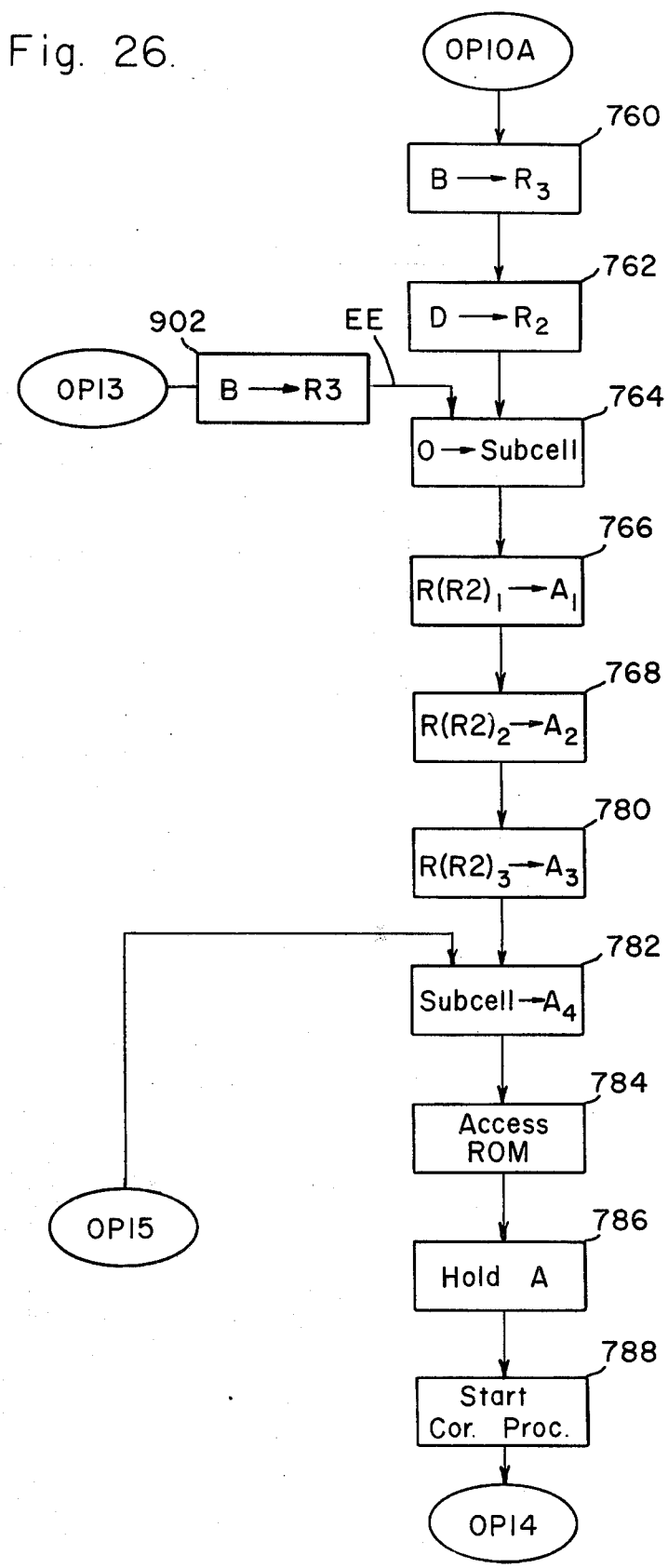
Figure 27:
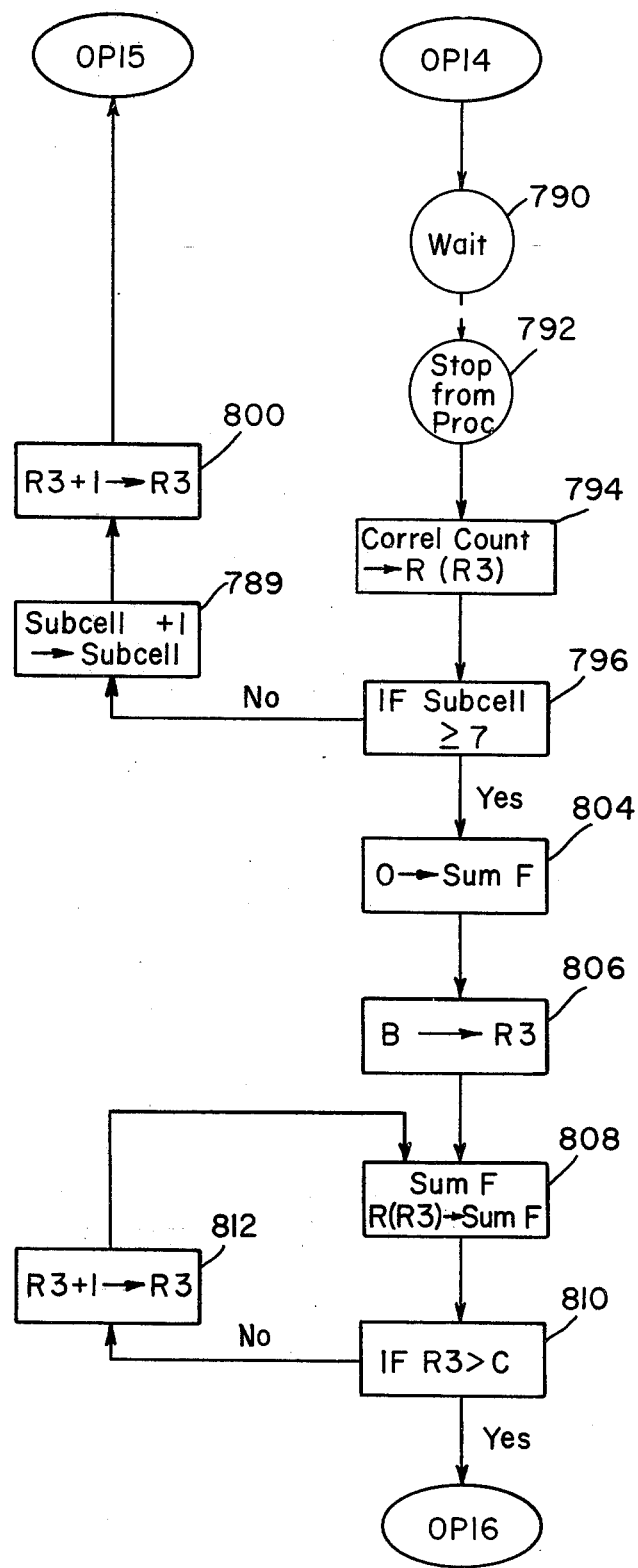
Figure 28:
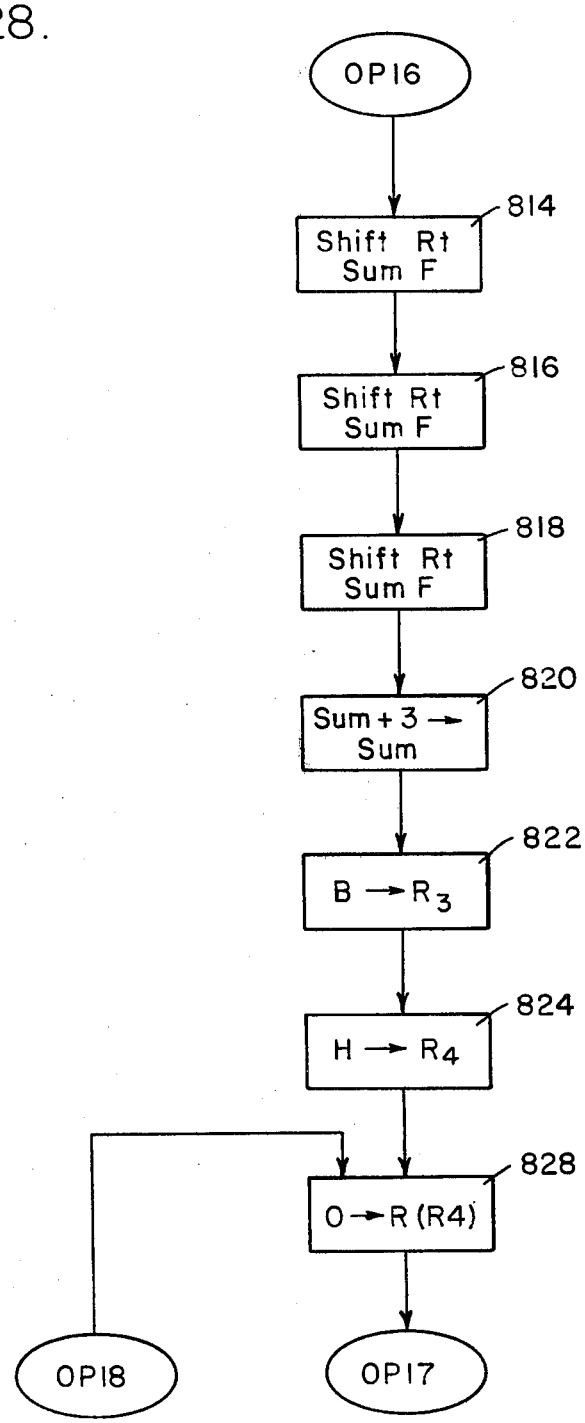
Figure 29:
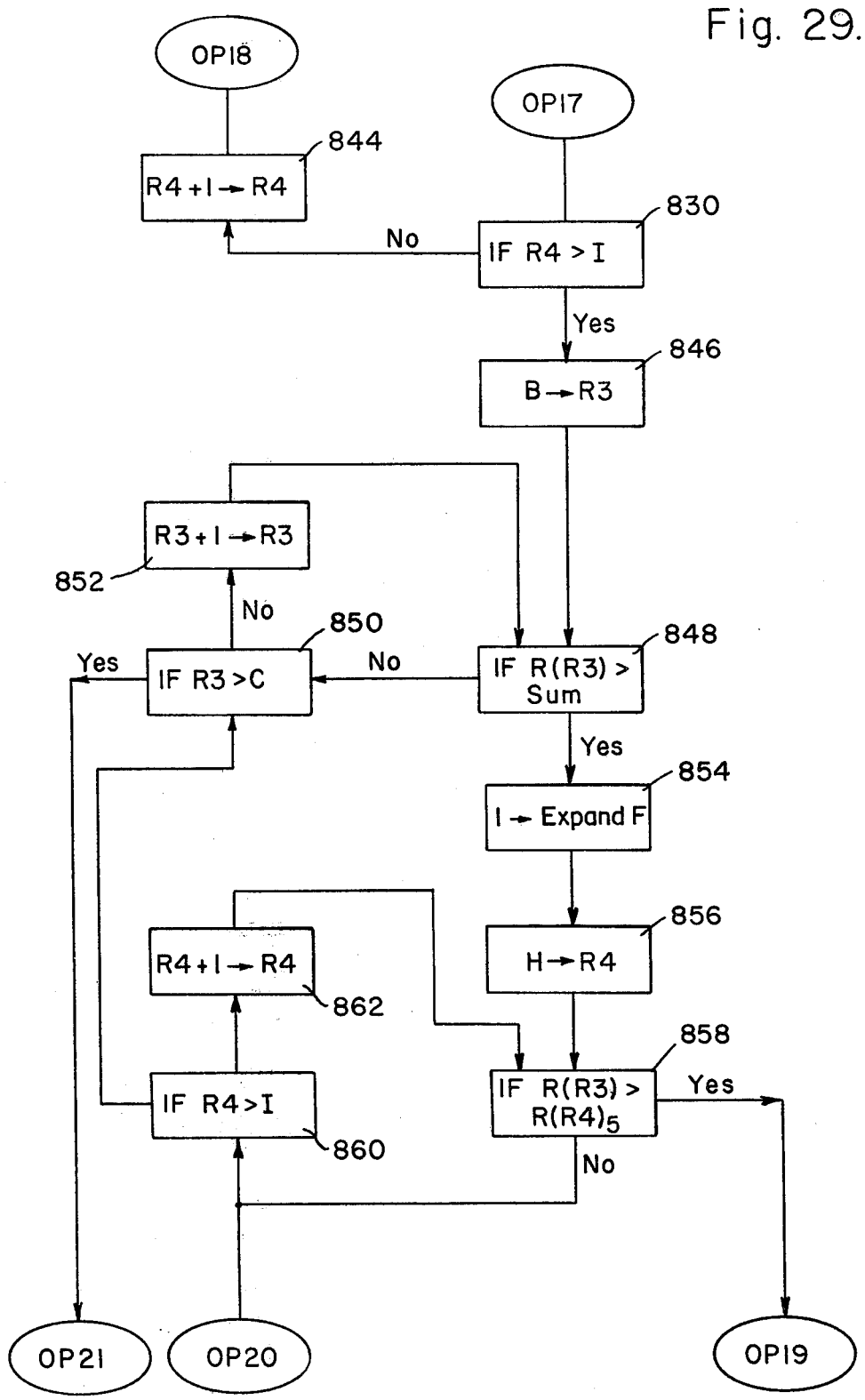
Figure 30:
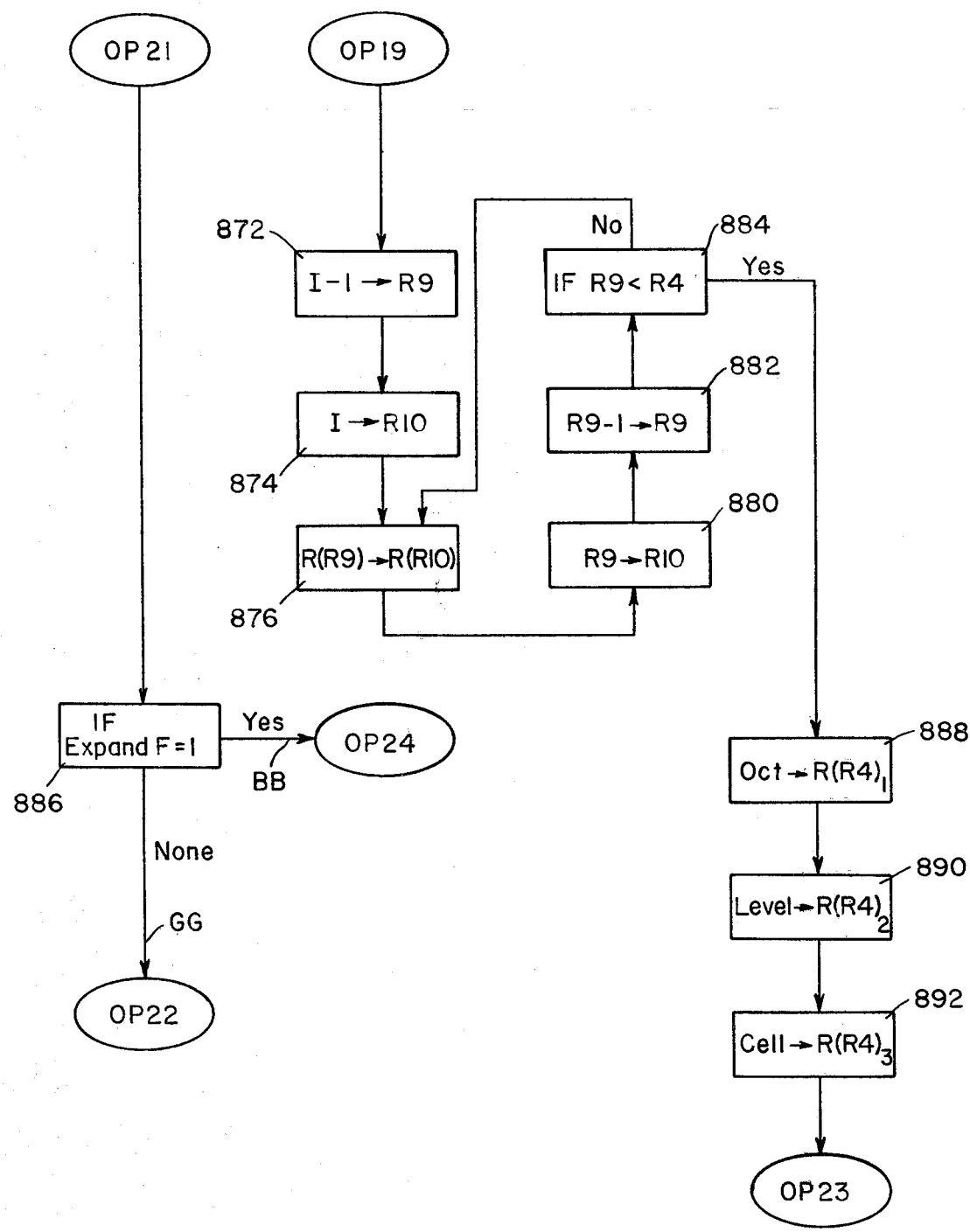
Figure 31:
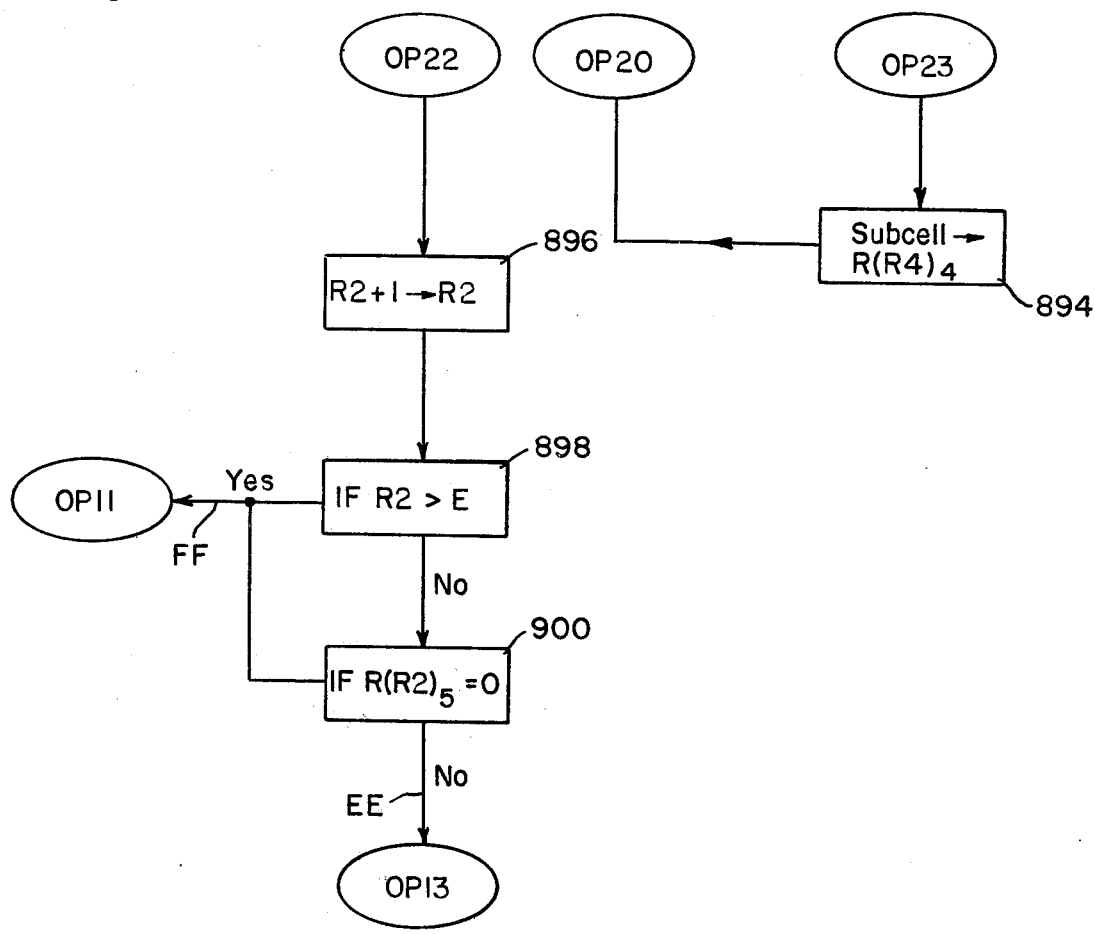
Figure 32:
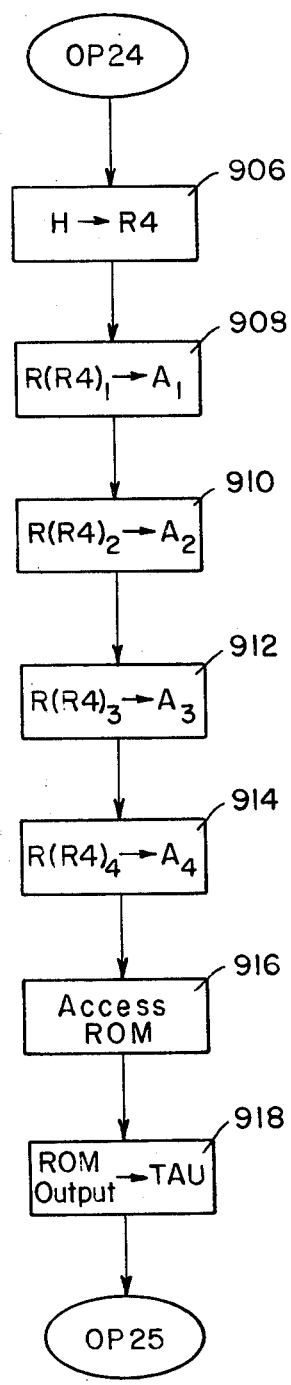

For further explanation of the ordering operation of blocks including blocks 690, 692, 698, 700 and 702, FIG. 22 shows the results of five passes through the ordering loop. In the first pass of a block 729 the pointers R6 and R7 address the bottom two registers. The pointer R2 points to the top of the group of registers in all of the blocks. Also the numbers E - 1 and E always point to the bottom two registers. In each of the blocks 729, 731, 733, 735 and 737 the address of pointer R6 is transferred to pointer R7 as indicated by the arrows. In the block 735, the pointer R6 has the same address as R2, and in the block 737 the pointer value R6 is greater than the R2 value as tested in the block 724 of the flow diagram, and the ordering loop stops the passes of shifting R7 and R6 and the data is written in the block 736 of FIG. 24 into the register addressed by pointer R2 in the blocks 728, 730, 732 and 734 of the flow diagram.

When an operation is being performed in the block 694, and the pointer value R1 is greater than C, the comparison is completed and the operation proceeds to a block 740 where a determination is made to see if the contents of the EXPAND cell is equal to 1, indicating whether the threshold has been exceeded in that octave. If the answer is no, showing that correlation counts where not found greater than the threshold in that coarse level octave, the operation proceeds to a block 744 passing along the DD path as previously discussed. The contents of the OCT register are incremented in the block 744 and as the calculation is completed in that octave, the contents of EXPAND are set to zero in a block 746 and a determination is made whether OCT is greater than 7 in a block 748. If the result of the comparison operation in the block 748 is yes, the operation proceeds to the idle circle 620 as all octaves have been considered. If the comparison results in the block 748 are no, the operation proceeds to a block 750 where the cell number is reset to 0 followed by proceeding to a block 752 where the address of the B cell is transferred to the pointer register R1. The operation then returns to the block 638 where a new address is started for a new value of $\tau$ and the cell calculation will be performed to form a new coarse list for the next octave. It is to be noted that the incrementing of the octave address in the box 744 may also be entered from the FF path which is from the fine level calculation to be subsequently explained.

If in the block 740 the contents of the EXPAND register are equal to 1, the AA path is followed indicating that at least one emitter has been found to exceed the threshold in the coarse level computation. The operation thus proceeds to the fine level computation starting at a block 760 where the starting address of the correlation count in the cell B is transferred to register R3 which is the pointer register for the fine level greater than threshold storage, R(H) - R(H+7). In a block 762 the constant D is transferred to the pointer R2 to address the first register in the previously ordered greater than threshold list. In a block 764 the subcell number is set to zero or the first subcell at which a correlation map of data will be formed. In respective blocks 766, 768, 780 and 782 the ROM address is created by storing the octave, a 1 indicating the fine level, cell and subcell.

The fine correlation operation then proceeds from the block 782 to access the ROM at the address in the A register in a block 784, hold or retain the $\tau$ and limit values at the input to the cell calculator in a block 786, and start the correlation process in a block 788 by applying a start signal to the cell calculator. A waiting operation is then entered in a circle 790 and upon receiving a stop signal from the cell calculator in a circle 792 the fine level correlation count is stored in a block 794 in the register R(R3) which is the first correlation count storage register. The determination is made in a block 796 whether the subcell number is greater or equal to 7 and if the answer is no, the operation proceeds to a block 798 where the contents of the SUBCELL register is incremented. In the next block 800 the contents of the pointer cell R3 are incremented to address the next fine cell correlation count storage register and the operation then proceeds to the block 782 where a new subcell number is stored in the ROM address for performing a cell calculation for that subcell.

When the subcell number is equal to 7 the operation proceeds from the block 796 to the block 804 where the number in the SUM F cell is reset preparatory to the threshold operation, and then proceeds to a block 806, where the word in the B register is written into the R3 pointer register or cell which is utilized to address the fine level cells that store the correlation count R(B) - R(B+7).

Summing of all values in registers R(B) - R(B+7) is then performed in blocks 808, 810 and 812. In the block 808 the contents of the SUM F register is combined with the value in the R(R3) register and the result is stored in the SUM F cell. The operation proceeds to the block 810 where the determination is made if R3 is greater than C indicating the bottom of the correlation count list, and if it is not, the operation proceeds to the block 812. The address of the pointer register R3 is incremented in the block 812 and the operation proceeds to the block 808 for forming another accumulation operation. When the pointer address R3 is greater than or equal to C, the operation then proceeds to a block 814 and in turn to blocks 816 and 818 where the sum is shifted three places to the right for the dividing or averaging operation. The average value is then combined with the offset value 3 in a block 820 to form the threshold value which is stored in the SUM F register. The contents of the B register are then transferred to the pointer register R3 in a block 822 so that the pointer address of the correlation count stack is at the top, and the contents of the H register are transferred in a block 824 to the cell R4 which is the pointer for fine ordering. The value H is the starting location for fine cell >storage of registers R(H) - R(H+7). At this time the correlation counts for the fine level subcells is stored in registers R(B) - R(B+7).

The ordering operation, which is similar to the ordering at the coarse level as explained relative to FIG. 22 then starts in a block 828 where the contents of the cell R(R4) are reset, the operation then proceeding to a block 830.

The value I defines the bottom address of the fine level greater than threshold registers, and if the bottom of the group of registers is not reached, the operation proceeds to a block 844 where the pointer R4 is incremented by 1 and the next register on the list is then reset in the block 828. Thus, in these three blocks 830, 844 and 828, the fine level greater than threshold storage registers are reset to zero and the operation proceeds to a block 846 where the value B is stored in the pointer register R3 which then points to the correlation count storage registers. The ordering loop now proceeds to a block 848 where the contents of each correlation count register is compared with the threshold and if the threshold is not exceeded, the operation proceeds to a block 850 to determine whether the operation is at the bottom of the correlation storage. If the result is no, the operation proceeds to a block 852 where the pointer register R3 is incremented by one and the threshold comparison of the block 848 is then repeated. When the threshold is exceeded in the block 848 the EXPAND F register has a 1 set therein in a block 854 indicating that the subcell exceeds the threshold and in a block 856 the value H which is a starting location for the fine cell greater than threshold storage is stored in the pointer register R4 which will address the registers R(H) to R(H+7).

In a block 858, the ordering process by comparing the register defined by the pointer R3 which at the start is the first register of the correlation count group with the contents of the fifth position of the register addressed by R4 which at the start is the first register of the fine level greater than threshold cells. If the correlation count is not greater than the first value, the operation proceeds to a block 860 where if the pointer R4 is not at the bottom of the list I, the operation proceeds to a block 862 where the pointer R4 is incremented followed by transfer of the operation to the block 858. When the end of the list is reached defined by the pointer R4, the operation proceeds from the block 860 to the block 850 and if R3 is not greater than C the operation of the block 852 is then performed. If the address is pointer register R3 is greater than C indicating that end of the correlation count list has been reached or the fine ordering is completed, the operation proceeds from the block 850 to a block 866 where a determination is made whether the EXPAND F register includes a 1 indicating that a threshold value has been found in one of the subcells.

If in the block 858 the correlation count exceeds the greater than threshold value as defined by the pointer R4, the operation proceeds to a block 872 where the value I (which represents the bottom of the stack) -1 is recorded in register R9. The register R10, in the operation of a block 874, has the value I stored therein followed by the operation of a block 876 where the pointer value in the register R9 is written into the register R10. In a block 880 the pointers are changed in the working registers by storing the pointer value in the register R9 and in the register R10. In the next step in a block 882, the value in the register R9-1 is stored in the register R9 so that the pointer addresses in register R1 and R10 have been moved up one register position. In a block 884 a test is made to determine if the address in the register R9 is less than the pointer value in the register R4 (to determine if the value in R9 is greater than in R4), and if it is not, a second pass is performed by repeating the operation of the block 876. If the result of this test is such that pointer value R4 in the register R8 is less than the value in the register R9, indicating that a word can be inserted into the greater than register, the operation proceeds to a block 888. In that block the contents of OCT are stored in the first position of the fine greater than threshold register defined by the pointer R4. In blocks 890, 892 and 894, the values in respective registers LEVEL, CELL, and SUBCELL are stored in respective second, third and fourth positions of the designated fine level greater than threshold register. At the completion of block 894 after entering data into the fine level greater than threshold register, the operation proceeds to the block 860 for further ordering. The type of ordering illustrated herein is well known in the art and will not be explained in further detail.

If in the block 866 the contents of EXPAND F are not equal to 1, indicating that a correlation count greater than threshold was not encountered at the fine level, the operation proceeds along path GG to a block 896 as the correlation has failed to detect an emitter. In the block 896, the pointer R2 is incremented to proceed to the next cell on the coarse list. In a block 898 a determination is made as to whether the value of the pointer register R2 is greater than E which is at the bottom of the coarse level list of the correlation count register, and if the answer is yes indicating that expansion operation is completed and failed each time, the operation proceeds along a path FF to the block 744 where the octave number is incremented. If the result of the operation in the block 898 is no, indicating that there are still values on the coarse level list, the operation proceeds to a block 900 where a determination is made whether the fifth position of the data in that register is equal to 0 and if this is true the operation then proceeds to the path FF. If in the block 900 the value is not 0 indicating that the list is not completed, the operation proceeds along the path EE because there is another entry on the list and the processor is not finished with the coarse list for fine expansion. The operation proceeds along path EE to a block 902 where the first correlation count register address B is stored in the pointer register R3 followed by a transfer to the block 764 for again startng a mapping operation at the newly defined subcell.

If in the block 886 the EXPAND F register has been set to 1 indicating that a fine correlation count has exceeded the threshold, the operation proceeds along path BB to a block 906 where the constant H is transferred to the pointer register R4 for a deletion operation of the TOA values that will contribute to the matches of that cell. The address for the ROM is then developed in blocks 908, 910, 912, and 914 with the ROM being accessed in a block 916. The $\tau$ value is then outputted from the ROM in a block 918 and either stored or held on the lines in a block 920. A delete pulse which may be at the 1 level is applied to the cell calculator in a block 922, the correlation process is started in the block 924 by a start pulse and the processor waits in a circle 926. The correlation processes are stopped by a stop pulse in a circle 928 and an output word shown by an output word 931 is transferred out of the processor memory to the display memory 40 in respective blocks 930, 932 and 934. In a block 936 the data may be transferred from the display memory 40 to the display, with the operation then proceeding through path CC to the block 746 where the contents of EXPAND are set to 0. Thus, the operation proceeds to control the cell calculator and to process the data in order to determine the periodicity value $\tau$ that represents the PRI value at various frequencies and angles of arrivals.

Figures 34, 36:
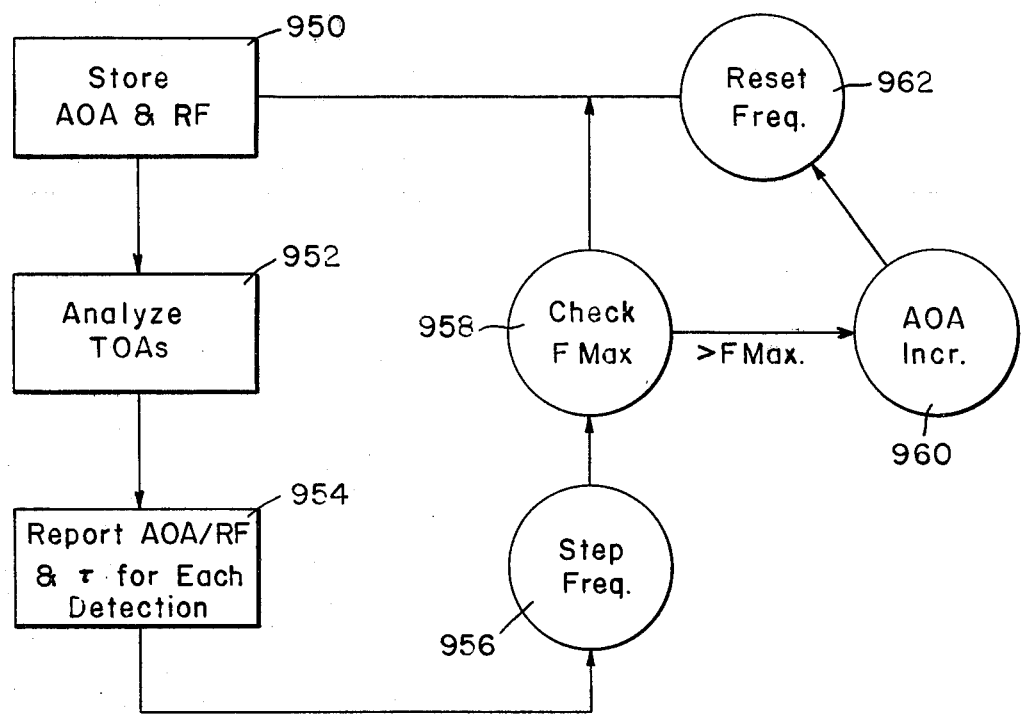
FIG. 34 is a schematic flow diagram for further explaining the overall operation of the illustrative system of FIG. 1.
FIG. 36 is a schematic diagram of a map of a portion of the output memory that may be utilized to display the PRI and other data developed by the system of the invention.

Referring now to FIGS. 34, 35 and 36 as well as to FIG. 1, the overall operation will be further explained from receiving a data to reporting the data to the display memory. The operation starts with storing AOA and RF in a block 950 followed by analyzing the time of arrivals in a block 952 as explained relative to the detailed flow diagram and the cell calculator. The angle of arrival RF an $\tau$ is reported for each detected emitter in a block 954. The frequency is stepped to the next value in a circle 956, a check is made for F MAX in a circle 958 and the operation proceeds to the circle 950 if the F MAX condition has been reached. At each termination of F MAX in the circle 958, the operation proceeds to a circle 960 where the angle of arrival AOA is incremented and the operation is transferred to a circle 962 where the frequency is reset and the operation then proceeds to the block 950. Until the frequency is stepped to F MAX, the operation proceeds from block 958 to 950. Although the functions of the flow diagram of FIG. 33 may be performed in a separate processor by a computer, it is illustrated as being performed in the processor 126 utilizing the associated memories. To further illustrate the overall operation a waveform 966 of FIG. 35 shows the angle of the least significant bit (LSB) indicating two angle of arrivals AOA1 and AOA2. During each LSB of the angle data gathering may be performed for frequencies F1, F2 and F3 as shown by a waveform 968 and an analysis, offset in time from the data gathering may be performed on that data as indicated by a waveform 970. During the period of the analysis upon finding a PRI value and performing a delete operation, the data is transferred to the display memory as shown by a waveform 972.

The output memory 40 is partially illustrated in FIG. 36 including one angle AOA, RF and PRI for each emitter that was analyzed. As the AOA changes, another group of RF and PRI data is detected and analyzed. The illustrated reported data may, for example, be derived from three data sets as illustrated for AOA1 in FIG. 33.

It is to be understood that within the scope of the invention, the control of the processor may be mechanized in ways other than that illustrated such as with a fixed hardware. Further, in accordance with the invention, the special purpose hardward of the cell calculator can be replaced by register transactions in a general purpose processor architecture, for example. In addition, within the scope of the invention, automated control of the cell calculator could be replaced by manual operator control if suitable interface arrangements are provided.

Thus, there has been described an autocorrelation calculating system for determining PRI of a plurality of emitters by responding to the digital presence rather than to the amplitude. The system includes a cell calculator that compares each time ordered TOA word of a data set with predetermined other TOA words to find comparisons between time adjacent pulses that have a PRI equal to an assumed periodicity $\tau$. The correlation is performed for cells of each of a plurality of octaves as defined by the selected values of $\tau$. The cell calculator may utilize a double comparison and the concept extended to triple or higher numbers of comparisons. It is to be noted that the autocorrelation process may use positive $\tau$ values as illustrated or may use negative $\tau$ values or both positive and negative values and be within the scope of the invention. The cell calculator is controlled to develop a data map or an eight cell histogram of correlation counts of a specific group of $\tau$s for each octave or period. The processor then examines the map and forms a list of amplitude ordered cells that exceed a calculated threshold level. At least the first cell on the list is then checked with an expanded time scale at a fine level, by selecting values of $\tau$ to perform a fine level autocorrelation and provide a histogram or map covering the specific set of 96 values. The largest correlation count from any subcell is then selected as the correlated emitter having a periodicity equal to the assumed $\tau$. The map or histogram at either the coarse or the fine level is used to determine the most likely PRI or PRIs at which emitters are operating. A deletion mode is then entered to flag or delete all TOA words that contribute to the activity or correlate in a subcell, to provide the largest correlation count. The system then performs a coarse level autocorrelation on the octave from which TOA data has been deleted to form a new coarse level list of cell correlation counts from which a fine level correlation can again be performed. The operation continues at this octave until all emitters have been correlated, before transferring the correlation to the next octave or map interval. Thus, it can be seen that the coarse correlation indicates the possible presence of emitters at the corresponding periodicity values and the fine level correlation is utilized for further determinations and to provide the periodicity value. The system of the invention is not limited to one fine level correlation but may include any desired number of fine or sub levels. Further, the invention is not limited to the illustrated source of pulse data but may receive TOA data from any suitable source. Also, the principles of the invention are not limited to any particular utilization device but the PRI data may be provided to additional processing or emitter identification systems. Although the illustrated system utilized an octave organized structure, for ease of digital calculation, it is to be understood that the organization may be sub-octave, decimal or have any suitable base.

What is claimed is:

1. An autocorrelation system for determining the PRI of a plurality of emitters emitting pulses of energy comprising:

first means for storing a plurality of TOA words each representing the time of arrival of a pulse;

a source of a plurality of assumed periodicity values having coarse level and fine level periodicity values;

second means coupled to said first means and to to said source for autocorrelating said TOA words at said plurality of assumed periodicity values and providing correlation counts related to an assumed periodicity value, said second means being controllable to provide said correlation counts at coarse levels or at fine levels;

third means coupled to control said source of periodicity values and to control said second means to selectively correlate said TOA words at a plurality of said coarse level periodicity values and said fine level periodicity values, and respectively provide coarse level and fine level correlation counts; and fourth means included in said third means for selecting correlation counts as a function of value and reporting a PRI corresponding to the assumed periodicity value of said selected correlation count.

2. The combination of claim 1 further comprising fifth means included in said second means and coupled to said first means and responding to said fourth means selecting a correlation count to delete corresponding TOA words in said first means.

3. A system for determining PRI values from emitters comprising:

memory means for providing a data set of time ordered TOA words;

first calculator means coupled to said memory means responsive to said TOA words to autocorrelate said TOA words and provide time correlation counts;

a source of periodicity values $\tau$ coupled to said calculator means for applying different $\tau$ values thereto representing increasing periodicity, to be combined with said TOA words for developing said time correlation counts; and second calculator means coupled to said source of periodicity values and to said first calculator means and responsive to said $\tau$ values and said time correlation counts for determining PRI values of emitters.

4. The combination of claim 3 in which said second calculator means further includes means coupled to said memory means for deleting, from further correlation, TOA words corresponding to the $\tau$ related to a determined PRI value.

5. The combination of claim 4 in which said source of periodicity values includes means to provide $\tau$ values over a selected number of octaves and over a selected number of time cells, each octave having a predetermined number of time cells.

6. The combination of claim 5 in which said second calculator means further includes control means coupled to said source and to said first calculator means so that the correlations and deletions of TOA words for each octave are sequentially completed.

7. The combination of claim 6 in which said second calculator means further includes means to control said source and said first calculator means to first provide a coarse level map of correlation counts of the cells of an octave and then provide a fine level map of correlation counts of selected cells of said octave, said second calculator means selecting from said fine level map of correlation counts, the $\tau$ value corresponding to an emitter for the PRI value.

8. The combination of claim 7 in which said second calculator means further includes threshold determining means for forming a list of cells from said coarse level map having correlation counts above a coarse level threshold and forming said fine level map from said list.

9. The combination of claim 8 in which said fine level threshold determining means forms a list of cells from said fine level map having correlation counts above threshold and said second calculator means further includes means for selecting the $\tau$ value corresponding to an emitter as that value associated with the maximum fine level correlation count above said threshold.

10. The combination of claim 9 in which said second calculator means further includes means to form a new coarse level map after said means for deleting has completed the operation.

11. The combination of claim 10 in which said second calculator means further includes means coupled to said source for providing a $\tau$ for the next octave when a coarse level map is formed without any correlation count values that exceeds said coarse level threshold value.

12. A system for forming a correlation count from a plurality of TOA words comprising:
  memory means for storing said TOA words in time order for access;
  a source of $\tau$ values and limit values;
  comparator means;
  first means coupled to said memory means, to said comparator means and to said source for combining a first TOA word with $\tau$ and said limit values to apply a first comparison TOA word to said comparator means,
  second means coupled to said memory means, to said comparator means and to said source for appying at least a second TOA word thereto for correlation with said first TOA word;
  correlation counts means; and
  third means coupled to said comparator means, to said correlation count means and to said memory means to control said comparator means for applying a correlation count to said correlation count means, and for controlling said memory means to apply a new first TOA word to said first means.

13. The combination of claim 12 further including means coupled to said source of $\tau$ values and to said first means for providing double the values of $\tau$ and the limits of said first and second TOA words upon detection of a correlation of said first and second TOA words and for applying a correlation count to sad correlation count means upon a second correlation between the first and second TOA words having double values of $\tau$ and the limits.

14. The combination of claim 13 further including P-counter means coupled to said memory means for addressing said first TOA words, C-counter means coupled to said memory means for addressing said second TOA word, and control means coupled to said third means, to said P-counter means and to said C-counter means for incrementing said C-counter means for each second TOA word and for incrementing said P-counter means in response to at least the detection of a second correlation.

15. A system for determining PRI from a plurality of TOA words representing the time of arrival of pulses from a plurality of emitters comprising:
  a source of assumed periodicity $\tau$ values for defining a plurality of map periods each having a plurality of time cells;
  cell calculator means responsive to said TOA words and said source of assumed periodicity values to detect correlation matches and provide a coarse level data map of correlation counts for the time cells of a map period;
  first means coupled to said cell calculator means and to said source of assumed periodicity values for responding to each coarse level data map to form an additional subcell data map of correlation counts and for selecting a subcell as a correlation count representative of an emitter PRI and having a PRI value related to the corresponding $\tau$ value.

16. A system for determining PRI from a plurality of TOA words representing repetitive pulse trains comprising:
  memory means for storing said TOA words for time ordered access;
  a source of assumed periodicity values defining a plurality of octave periods and a plurality of periods of each octave period;
  calculator means coupled to said memory means and to said source of assumed periodicity values, for autocorrelating said TOA words at said assumed periodicity values during each of said plurality of octave periods to provide correlation counts; and
  control means coupled to said calculator means to select as a function of value, correlation counts that represent repetitive pulse trains, said control means sequentially controlling said calculator means for autocorrelating each octave until none of the correlation counts are selected.

17. The combination of claim 16 in which said calculator means includes means for autocorrelate said TOA words at a coarse level, and at least one fine level in which selected ones of said plurality of periods of an octave period are expanded in time.

18. The combination of claim 16 in which said control means further includes means to delete TOA words which autocorrelate with the corresponding periodicity value.

19. A system for determining PRI from a plurality of emitters transmitting pulses of energy comprising:
receiving means responsive to said pulses of energy to develop TOA words,
memory means coupled to said receiving means for storing said TOA words for time ordered access;
a source of assumed periodicity values defining a plurality of octave periods and a plurality of periods during each octave period;
calculator means coupled to said memory means and to said source of assumed periodicity values, for autocorrelating said TOA words at said assumed periodicity values during each period of said plurality of octave periods to provide correlation counts; and
control means coupled to said calculator means to select as a function of value, correlation counts that represent repetitive pulse trains, said control means controlling said calculator means to sequentially autocorrelate each octave until none of the correlation counts are selected.

20. The combination of claim 19 in which said control means further includes means to delete TOA words which autocorrelate with the corresponding periodicity vale.

21. A system for determining the group PRI of a plurality of TOA words each representing the time of arrival of a pulse of energy from an emitter comprising:
first means for storing said plurality of TOA words
a source of a plurality of assumed group periodicity values; having coarse level and fine level periodicity values;
second means coupled to said first means and to said source for autocorrelating said TOA words at said plurality of assumed periodicity values and providing correlation counts related to an assumed periodicity value, said second means being controllable to provide said correlation counts at coarse levels or at fine levels;
third means coupled to control said source of periodicity values and to control said second means to selectively correlate said TOA words at a plurality of said coarse level periodicity values and said fine level periodicity values, and respectively provide course level and fine level correlation counts; and
fourth means included in said third means for selecting correlation counts as a function of value and reporting a group PRI corresponding to the assumed periodicity value of said selected correlation count.

* * * * *